(12) United States Patent
Chi et al.

(10) Patent No.: US 9,965,851 B2
(45) Date of Patent: May 8, 2018

(54) METHOD FOR INSPECTING PATTERN AND AN APPARATUS FOR MANUFACTURING A SEMICONDUCTOR DEVICE USING THE SAME

(71) Applicant: Samsung Electronics Co., Ltd., Suwon-si, Gyeonggi-do (KR)

(72) Inventors: Kaiyuan Chi, Hwaseong-si (KR); Kiho Yang, Hwaseong-si (KR); Seunghune Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 130 days.

(21) Appl. No.: 15/051,814

(22) Filed: Feb. 24, 2016

(65) Prior Publication Data
US 2016/0275663 A1 Sep. 22, 2016

(30) Foreign Application Priority Data

Mar. 17, 2015 (KR) ........................ 10-2015-0036822

(51) Int. Cl.

| | | |
|---|---|---|
| G06K 9/00 | (2006.01) | |
| G06T 7/00 | (2017.01) | |
| G06K 9/46 | (2006.01) | |
| G06T 7/11 | (2017.01) | |
| G06T 7/12 | (2017.01) | |
| G06T 7/155 | (2017.01) | |
| G06K 9/68 | (2006.01) | |
| H01L 21/66 | (2006.01) | |

(52) U.S. Cl.
CPC ............ G06T 7/001 (2013.01); G06K 9/4604 (2013.01); G06K 9/685 (2013.01); G06T 7/11 (2017.01); G06T 7/12 (2017.01); G06T 7/155 (2017.01); *G06K 2209/19* (2013.01); *G06T 2207/10061* (2013.01); *G06T 2207/30148* (2013.01); *G06T 2207/30172* (2013.01); *H01L 22/12* (2013.01)

(58) Field of Classification Search
CPC ... G06T 7/11; G06T 7/12; G06T 7/155; G06T 7/001; G06T 2207/30148; G06T 2207/10061; G06T 2207/30172; H01L 22/12; G06K 9/4604; G06K 9/685; G06K 2209/19
USPC ......................................... 382/141, 145, 149
See application file for complete search history.

(56) References Cited

U.S. PATENT DOCUMENTS

| | | | |
|---|---|---|---|
| 4,721,684 A | 1/1988 | Musumeci | |
| 7,358,199 B2 * | 4/2008 | Wu | .................... G01N 21/9501 257/E21.259 |

(Continued)

FOREIGN PATENT DOCUMENTS

| | | |
|---|---|---|
| FR | 2575330 | 6/1986 |
| JP | H0777495 | 3/1995 |

(Continued)

*Primary Examiner* — Daniel Mariam
(74) *Attorney, Agent, or Firm* — Myers Bigel, P.A.

(57) ABSTRACT

The inventive concepts provide a method for inspecting a pattern, a method for manufacturing a semiconductor device, and an apparatus used according to the methods. The method for inspecting a pattern includes detecting a measured image corresponding to a pattern formed on a substrate, detecting a first hot spot corresponding to a ghost image of the measured image, with the first hot spot representing a defect of the pattern, and detecting a second hot spot that has an area that is wider than that of the first hot spot.

17 Claims, 33 Drawing Sheets

(56) References Cited

U.S. PATENT DOCUMENTS

| | | | |
|---|---|---|---|
| 7,884,322 B2 | 2/2011 | Sasajima et al. | |
| 8,163,468 B2 * | 4/2012 | Hishiro | G03F 7/423 |
| | | | 430/322 |
| 8,611,638 B2 | 12/2013 | Nagahama et al. | |
| 8,867,818 B2 | 10/2014 | Matsuoka et al. | |
| 9,153,020 B2 * | 10/2015 | Takagi | H01L 22/12 |
| 2014/0307946 A1 * | 10/2014 | Nakahira | G06T 7/0004 |
| | | | 382/149 |

FOREIGN PATENT DOCUMENTS

| | | |
|---|---|---|
| JP | 2009164452 | 7/2009 |
| JP | 2012169571 | 9/2012 |
| JP | 2013-236031 | 11/2013 |
| JP | 2013-236061 | 11/2013 |
| KR | 20080087427 | 10/2008 |
| KR | 20110016772 | 2/2011 |

\* cited by examiner

METHOD FOR INSPECTING PATTERN AND AN APPARATUS FOR MANUFACTURING A SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2015-0036822, filed on Mar. 17, 2015, the disclosure of which is hereby incorporated by reference in its entirety.

BACKGROUND

The inventive concepts relate to a method for manufacturing a semiconductor device and an apparatus for manufacturing a semiconductor device using the same. More particularly, the inventive concepts relate to a method for inspecting a pattern and an apparatus for manufacturing a semiconductor device using the same.

A semiconductor device may be manufactured by a plurality of unit processes. The unit processes may include a thin layer deposition process, a photolithography process, an etching process, an ion implantation process, and/or a cleaning process. The photolithography process is a process for forming a photoresist pattern on a substrate. The photolithography process is an important process that determines a critical dimension (CD) of a semiconductor device, and thus, defects of photoresist patterns are periodically detected.

SUMMARY

Embodiments of the inventive concepts may provide a method for inspecting patterns capable of automatically inspecting a defect of patterns, and a method for manufacturing a semiconductor device using the same.

Embodiments of the inventive concepts may also provide an apparatus for manufacturing a semiconductor device capable of automatically performing a pattern inspection.

In one aspect, a method for inspecting a pattern may include detecting a measured image corresponding to a pattern formed on a substrate, detecting a first hot spot corresponding to a ghost image of the measured image, the ghost image being or representing a defect of the pattern, and detecting a second hot spot of which an area is wider than that of the first hot spot.

In another aspect, an apparatus for manufacturing a semiconductor device may include a spinner forming or configured to form a photoresist on a substrate, an exposure unit disposed at a side of the spinner and providing or configured to provide light used for exposing the photoresist, and an inspection unit disposed at another side of the spinner and inspecting or configured to inspect a defect of the photoresist. The inspection unit may include a measurement part measuring or configured to measure the photoresist and the substrate to obtain a measured image, and a control part controlling or configured to control the measurement part to detect a first hot spot and a second hot spot. The first hot spot may correspond to a ghost image of the measured image, which is or represents a defect of the photoresist. An area of the second hot spot may be wider than that of the first hot spot.

In another aspect, a method for inspecting a pattern may include: detecting a measured image corresponding to a pattern formed on a substrate; detecting a first hot spot corresponding to a ghost image of the measured image, wherein the ghost image represents a defect of the pattern; and detecting a second hot spot that has an area that is wider than an area of the first hot spot. Detecting the first hot spot may include: obtaining a first measured unicolored image comprising a first measured contour line by binarizing the measured image or by differentiating the measured image with respect to intensity; and determining whether the first hot spot exists in the first measured unicolored image and, if so, recording the first hot spot on the ghost image. Detecting the second hot spot may include: differentiating the first measured unicolored image with respect to intensity to obtain a second measured unicolored image comprising a plurality of second contour lines; and determining whether the second hot spot exists in the second measured unicolored image and, if so, recording the second hot spot on the ghost image.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
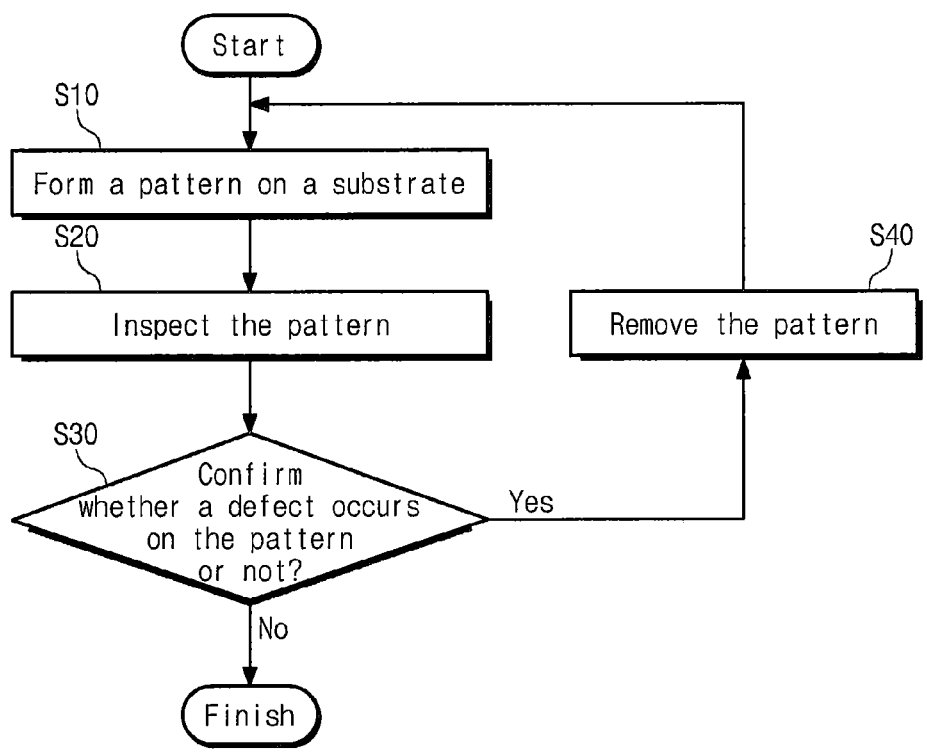
FIG. 1 is a flow chart illustrating a method for manufacturing a semiconductor device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with plan, side and/or sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third, etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Exemplary embodiments of aspects of the present inventive concepts explained and illustrated herein include their complementary counterparts. The same reference numerals or the same reference designators denote the same elements throughout the specification.

Figure 2:
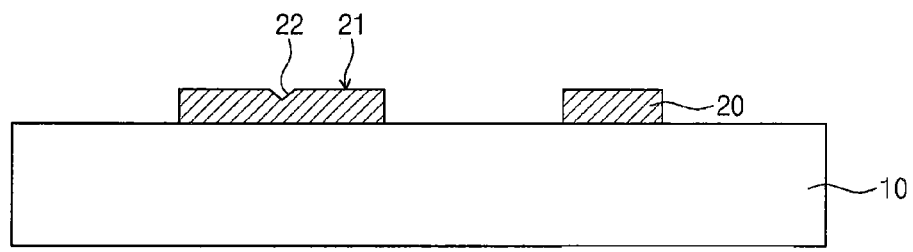
FIG. 2 is a cross-sectional view illustrating a pattern formed on a substrate by the manufacturing method of FIG. 1.

FIG. 1 is a flow chart illustrating a method for manufacturing a semiconductor device according to example embodiments of the inventive concepts. FIG. 2 is a cross-sectional view illustrating a pattern 20 formed on a substrate 10 by the manufacturing method of FIG. 1.

Referring to FIGS. 1 and 2, a method for manufacturing a semiconductor device according to the inventive concepts may include forming a pattern 20 on a substrate 10 (S10), inspecting the pattern 20 (S20), confirming whether a defect occurs on the pattern 20 or not (S30), and removing the pattern 20 (S40).

For example, the substrate 10 may include a silicon wafer or a glass. A method of forming the pattern 20 may be varied depending on a kind of the pattern 20. The pattern 20 may include a photoresist, a dielectric, or a conductive material. For example, if the pattern 20 includes the photoresist, forming the pattern 20 (S10) may include a photolithography process.

Inspecting the pattern 20 (S20) may include inspecting a top surface 21 of the pattern 20. For example, the top surface 21 of the pattern 20 may be measured by an electrical inspection method or an optical inspection method. For example, if a dent 22 is formed on the top surface 21, the dent 22 of the top surface 21 may be measured as a defect of the pattern 22. This may be because the defect is unexpected during the formation of the pattern 20. The dent 22 may be generated by feature printing, side slop, or scum, for example.

Confirming whether the defect occurs on the pattern 20 or not (S30) may include qualitatively and quantitatively confirming the pattern 20. If the defect of the pattern 20 is small or does not exist, the pattern 20 may be identified as a good pattern or defect-free pattern or substantially defect-free pattern and the process of forming the pattern 20 may be finished.

If a size of the defect of the pattern 20 is equal to or greater than a predetermined size or the number of the defects of the pattern 20 is equal to or greater than a predetermined number, the pattern 20 may be removed from the substrate 10 (S40). Thereafter, forming a pattern 20 (S10), inspecting the pattern 20 (S20), and confirming whether a defect occurs on the pattern 20 or not (S30) may be repeatedly performed.

Figure 3:
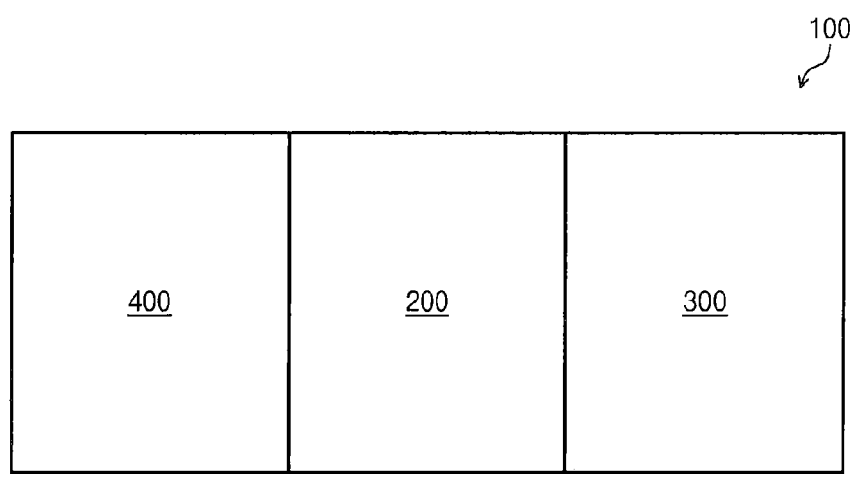
FIG. 3 is a schematic block diagram illustrating an embodiment of an apparatus used to perform the manufacturing method of FIG. 1.
Figure 4:
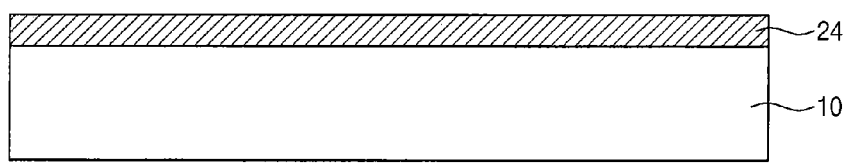
FIG. 4 is a cross-sectional view illustrating a photoresist formed by a spinner of the apparatus of FIG. 3.

FIG. 3 is a schematic block diagram illustrating an embodiment of an apparatus 100 used to perform the manufacturing method of FIG. 1. FIG. 4 is a cross-sectional view illustrating a photoresist 24 formed by a spinner 200 of FIG. 3.

Referring to FIGS. 2, 3, and 4, an apparatus 100 for manufacturing a semiconductor device may include a photolithography apparatus. In some embodiments, the apparatus 100 may include a spinner 200, an exposure unit 300, and an inspection unit 400. A photoresist 24 may be formed on the substrate 10 by the spinner 200. The photoresist 24 may be exposed to light by the exposure unit 300. The spinner 200 may develop the exposed photoresist 24 to form the pattern 20. The inspection unit 400 may inspect the pattern 20.

Figure 5:
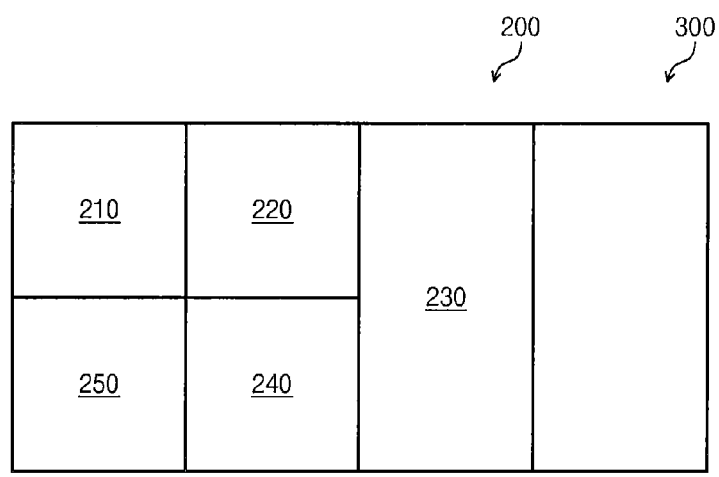
FIG. 5 is a plan view illustrating the spinner of FIG. 3.

FIG. 5 is a plan view illustrating the spinner 200 of FIG. 3.

Referring to FIGS. 2 and 5, the spinner 200 may include a loader 210, a spin coater 220, a baker 230, a developer 240, and an unloader 250. The loader 210, the spin coater 220, and the baker 230 may be sequentially arranged. The loader 210 may provide or load the substrate 10 into the spin coater 220. The spin coater 220 may coat the photoresist 24 on the substrate 10. For example, the spin coater 220 may rotate the substrate 10 and may coat the photoresist 24 on the rotating substrate 10. The baker 230 may heat the substrate 10 having the photoresist 24 to remove a solvent included in the photoresist 24. For example, the baker 230 may include a hot plate. Thereafter, the substrate 10 may be provided into the exposure unit 300. The developer 240 may develop the photoresist 24 exposed to the light in the exposure unit 300 to form the pattern 20. The unloader 250 may transfer the substrate 10 from the developer 240 into the inspection unit 400. Even though not shown in the drawings, the apparatus 100 may further include a cleaner that cleans the pattern 20 or the photoresist 24. The cleaner may be disposed between the inspection unit 400 and the loader 210 and/or the inspection unit 400 and the unloader 250. In some embodiments, the cleaner may remove the pattern 20 on which the defect occurs. The substrate 10 from which the pattern 20 is removed may be provided again into the loader 210.

Figure 6:
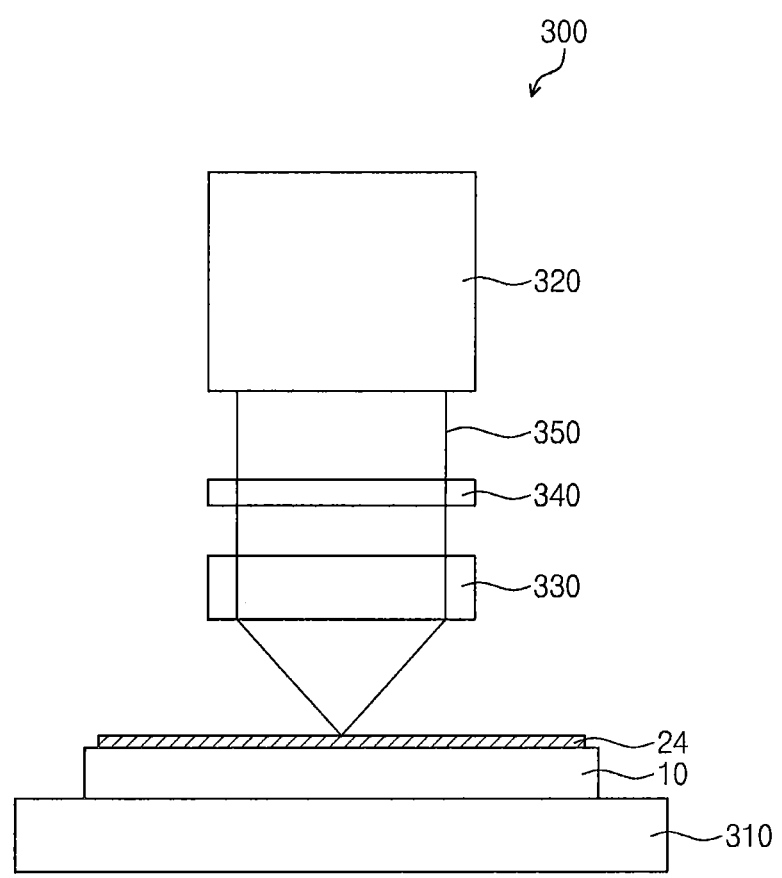
FIG. 6 is a side view illustrating an exposure unit of the apparatus of FIG. 3.

FIG. 6 is a side view illustrating the exposure unit 300 of FIG. 3.

Referring to FIG. 6, the exposure unit 300 may include a stage 310, a light source 320, an objective lens 330, and a reticle 340. The stage 310 may support the substrate 10. The light source 320 may generate ultraviolet light 350. The ultraviolet light 350 may be provided into the reticle 340 and the objective lens 330. The objective lens 330 may focus the ultraviolet light 350 on the photoresist 24. The reticle 340 may be disposed between the objective lens 330 and the light source 320. The reticle 340 may have a target pattern. The ultraviolet light 350 may transfer the target pattern to the photoresist 24.

Figure 7:
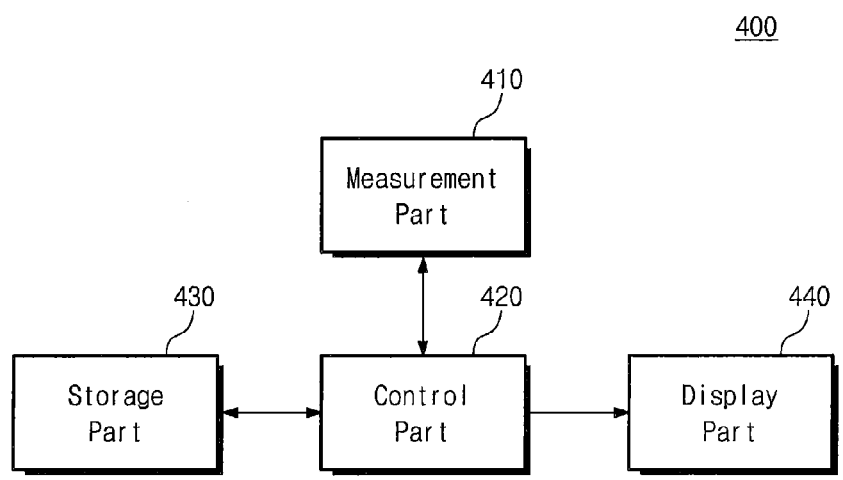
FIG. 7 is a schematic block diagram illustrating an embodiment of an inspection unit of the apparatus of FIG. 3.

FIG. 7 is a schematic block diagram illustrating an embodiment of the inspection unit 400 of FIG. 3.

Referring to FIG. 7, the inspection unit 400 may include a measurement part or measurement unit 410, a control part or controller 420, a storage part or storage unit 430, and a display part or display unit 440. The measurement part 410 may measure the pattern 20 formed on the substrate 10 to obtain data corresponding to the substrate 10 and the pattern 20. The control part 420 may control the measurement part 410, the storage part 430, and the display part 440. The storage part 430 may store the data. The data may include image data of the substrate 10 and the pattern 20. The control part 420 may input/output the image data into/from the storage part 430. The display part 440 may display images of the substrate 10 and the pattern 20.

Figure 8:
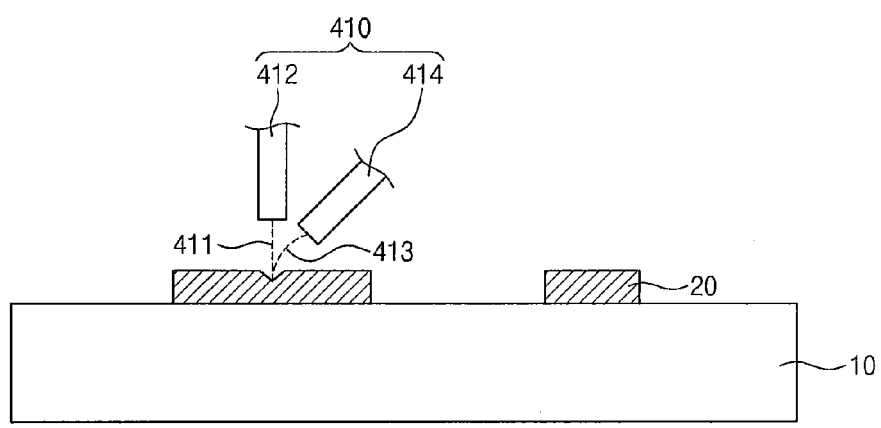
FIG. 8 is a side view illustrating an embodiment of a measurement part of the inspection unit of FIG. 7.

FIG. 8 is a side view illustrating an embodiment of the measurement part 410 of FIG. 7.

Referring to FIGS. 7 and 8, the measurement part 410 may include a scanning electron microscope (SEM). In some embodiments, the measurement part 410 may include an electron gun 412 and a detector 414. The electron gun 412 may irradiate an electron beam 411 to the substrate 10 and the pattern 20. The irradiated electron beam 411 may generate secondary electrons 413 from the pattern 20 and the substrate 10. The detector 414 may be disposed to be adjacent to the electron gun 412. The detector 414 may detect the secondary electrons 413. The detector 414 may provide data corresponding to the image of the pattern 20 to the control part 420. The electron gun 412 and the detector 414 may be disposed to be closer to the pattern 20 than to the substrate 10. The detector 414 may detect more secondary electrons 413 from the pattern 20 than from the substrate 10. The control part 420 may output data having a contrast in brightness according to a detected amount of the secondary electrons 413 to the display part 440. The display part 440 may display the images of the substrate 10 and the pattern 20 according to the contrast in brightness. For example, the display part 440 may display the images of the substrate 10 and the pattern 20 with about 256 degrees of brightness.

The control part 420 may obtain, display, calculate, compare, record, and overlap the image data of the substrate 10 and the pattern 20. Hereinafter, a method of treating the data will be described by means of obtaining, displaying, recording, and overlapping the image data by the control part 420.

Figure 9:
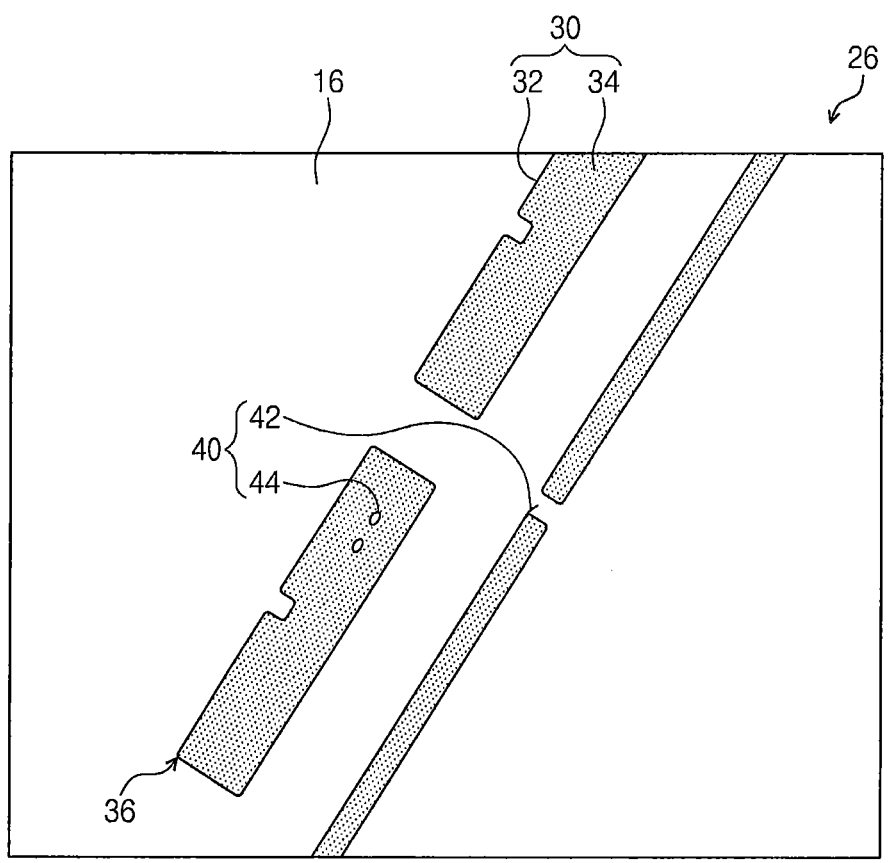
FIG. 9 is a plan view illustrating a measured pattern image obtained by a detector of the measurement part of FIG. 8.

FIG. 9 is a plan view illustrating a measured pattern image 30 obtained by the detector 414 of FIG. 8.

Referring to FIGS. 1, 2, 8, and 9, a measured image 26 may be an image detected by the detector 414. The measured image 26 may correspond to the images of the substrate 10 and the pattern 20 which are obtained in real time. For example, the measured image 26 may include a measured substrate image 16 and the measured pattern image 30. The measured pattern image 30 may be darker than the measured substrate image 16. Alternatively, the measured pattern image 30 may be brighter than the measured substrate image 16. The measured pattern image 30 may include a measured contour line 32 and a measured inner region 34. The measured contour line 32 may surround the measured inner region 34. The measured contour line 32 may have a rounded corner 36. The measured contour line 32 may correspond to an edge of the top surface 21 of the pattern 20. Alternatively, the measured contour line 32 may correspond to a boundary between the pattern 20 and the substrate 10. The measured inner region 34 may correspond to the top surface 21 of the pattern 20.

Generally, a brightness ratio of the measured contour line 32 to the brightness measured substrate image 16 obtained by the measurement part 410 including the SEM may be far higher than a brightness ratio of the measured inner region 34 to the measured substrate image 16. The measured contour line 32 may be clearer than the measured substrate image 16 and the measured inner region 34. Thus, the measured contour line 32 may be useful in inspecting the pattern 20 (S20) and confirming whether the defect occurs on the pattern 20 or not (S30).

Meanwhile, the measured pattern image 30 may have a ghost image 40. The ghost image 40 may be an image unexpected during the formation of the pattern 20. In other words, the ghost image 40 may be a defect image corresponding to the dent 22 of the pattern 20. The ghost image 40 may be shown in the inside or at an edge of the measured pattern image 30. In some embodiments, the ghost image 40 may include a contour ghost image 42 and an inner ghost image 44. The contour ghost image 42 may be detected at the measured contour line 32, and the inner ghost image 44 may be detected in the measured inner region 34. However, the contour ghost image 42 and the inner ghost image 44 may be very small in the measured image 26. The control part 420 may not directly distinguish the contour ghost image 42 and the inner ghost image 44 from the measured pattern image 30. Thus, the control part 420 may overlap the measured contour line 32 with a target contour line 52 of a target image 28 of FIG. 10 and then may record positions of the contour ghost image 42 and the inner ghost image 44.

Figure 10:
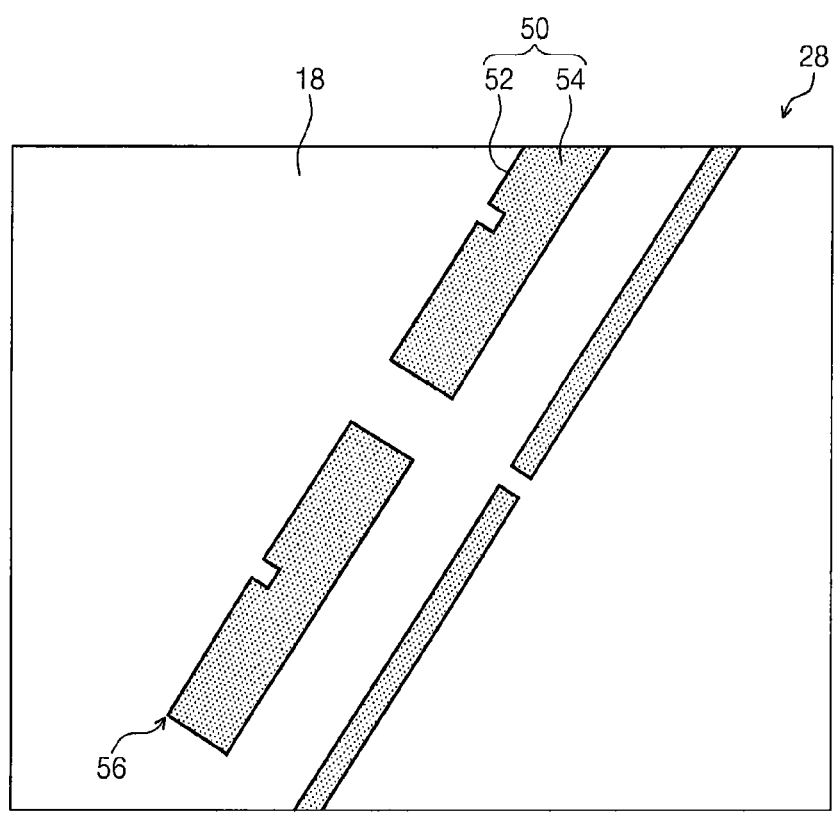
FIG. 10 is a plan view illustrating a target image corresponding to a measured image of FIG. 9.

FIG. 10 is a plan view illustrating a target image 28 corresponding to the measure image 26 of FIG. 9.

Referring to FIGS. 6, 9, and 10, the target image 28 may correspond to an image of the substrate 10 and the pattern 20 desired to be formed by the manufacturing method. The target image 28 may be a reference image of the measured image 26. The target image 28 may be stored in the storage part 430. The target image 28 may include a target pattern image 50 and a target bare image 18. The target pattern image 50 may correspond to a transfer pattern of the reticle 340. For example, a size of the target pattern image 50 may be substantially equal to a fourth of a size of the transfer pattern of the reticle 340. The target pattern image 50 may include a target contour line 52 and a target inner region 54. The target contour line 52 may correspond to a boundary of the desired pattern 20. The target contour line 52 may have an angular corner 56. The target contour line 52 may be compared with the measured contour line 32. The target inner region 54 may be surrounded by the target contour line 52. The target bare image 18 may correspond to the remaining portion of the reticle 340 except the transfer pattern.

Figure 11:
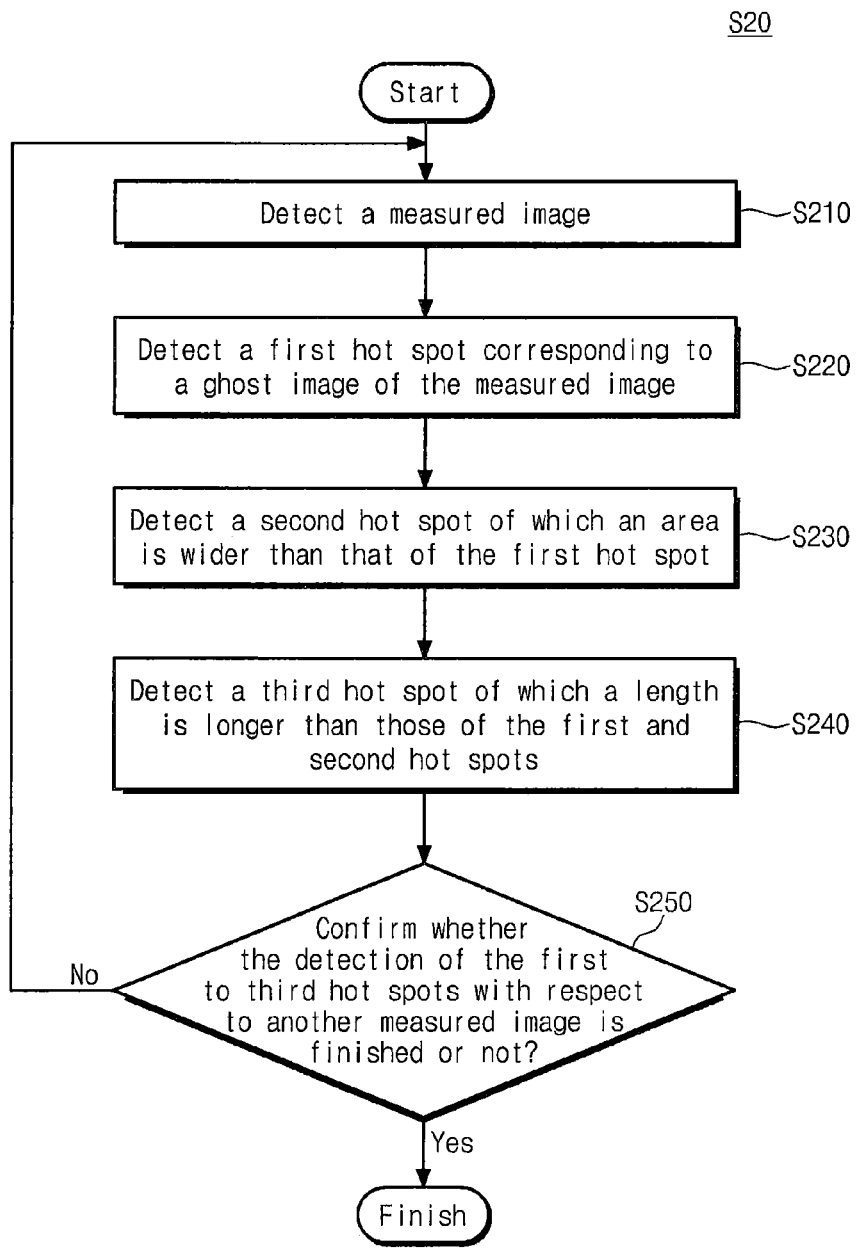
FIG. 11 is a flow chart illustrating a process of inspecting a pattern of FIG. 1.

FIG. 11 is a flow chart illustrating the process (S20) of inspecting the pattern 20 of FIG. 1.

Referring to FIGS. 1, 2, 7, and 11, the control part 420 may perform the step of inspecting the pattern 20 (S20). In some embodiments, inspecting the pattern 20 (S20) may include obtaining the measured image 26 (S210), detecting first, second, and third hot spots (S220, S230, and S240), and determining whether the detection of the first to third hot spots is finished or not (S250). Obtaining the measured image 26 may include obtaining the measured pattern image 30 and the measured substrate image 16. The measured pattern image 30 and the measured substrate image 16 may be obtained from the measurement part 410. Detecting the first to third hot spots (S220 to S240) may include detecting the contour ghost image 42 and the inner ghost image 44. Determining whether the detection of the first to third hot spots is finished or not (S250) may include confirming whether detection of the ghost image 40 is finished or not.

Figure 12:
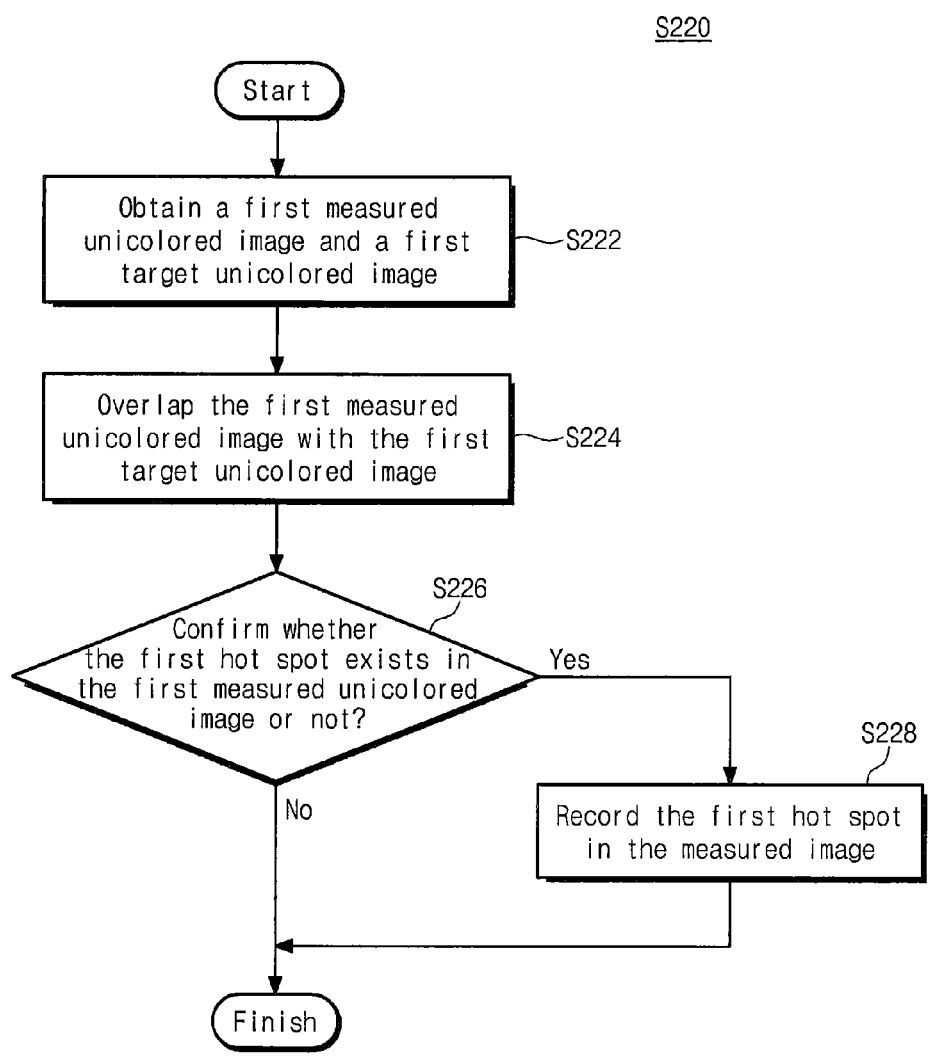
FIG. 12 is a flow chart illustrating an embodiment of a process of detecting a first hot spot of FIG. 11.
Figure 16:
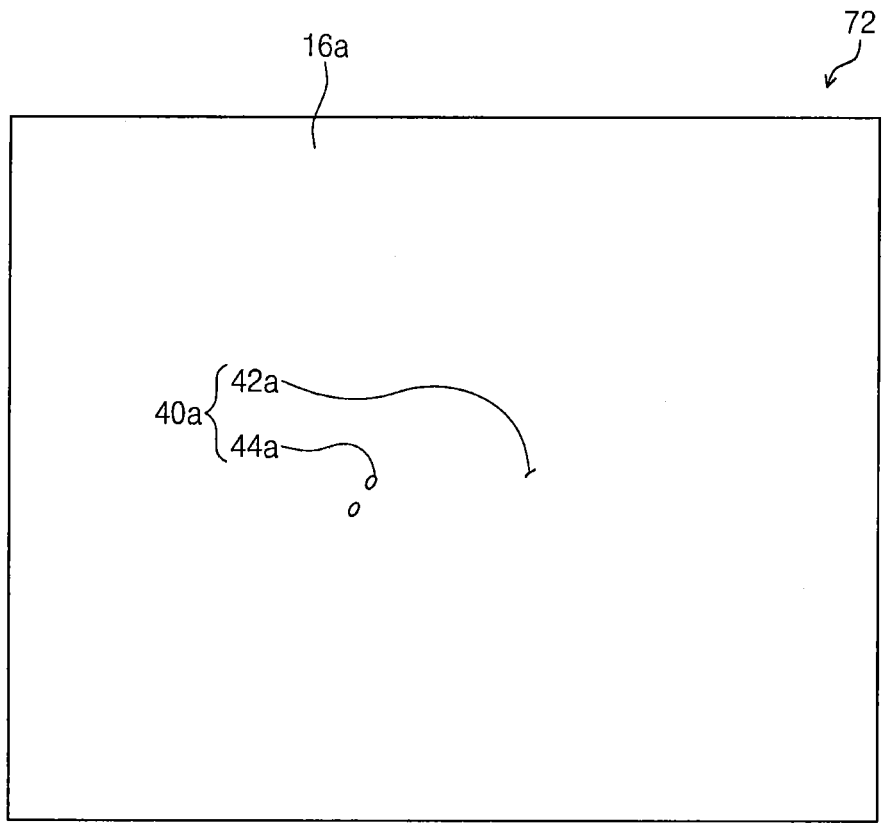
Figure 17:
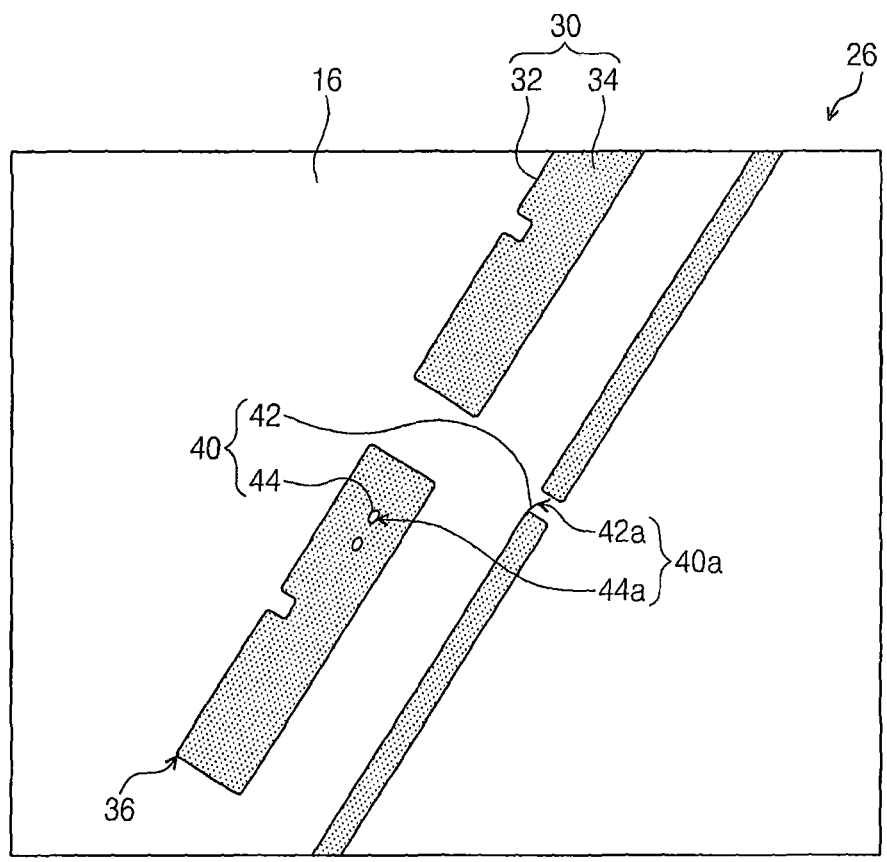
FIG. 17 is a plan view illustrating a measured image in which a first hot spot of FIG. 16 is represented.

FIG. 12 is a flow chart illustrating an embodiment of the process (S220) of detecting the first hot spot of FIG. 11. FIGS. 13 to 16 are plan views illustrating a first measured unicolored image 72 and a first target unicolored image 82 in the process (S220) of detecting the first hot spot 40a of FIG. 12. FIG. 17 is a plan view illustrating a measured image 26 in which a first hot spot 40a of FIG. 16 is represented.

Referring to FIGS. 12 to 16, detecting a first hot spot 40a (S220) may include obtaining a first measured unicolored image 72 and a first target unicolored image 82 (S222), overlapping the first measured unicolored image 72 and the first target unicolored image 82 with each other (S224), confirming the first hot spot 40a (S226), and recording the first hot spot 40a (S228).

Figure 13:
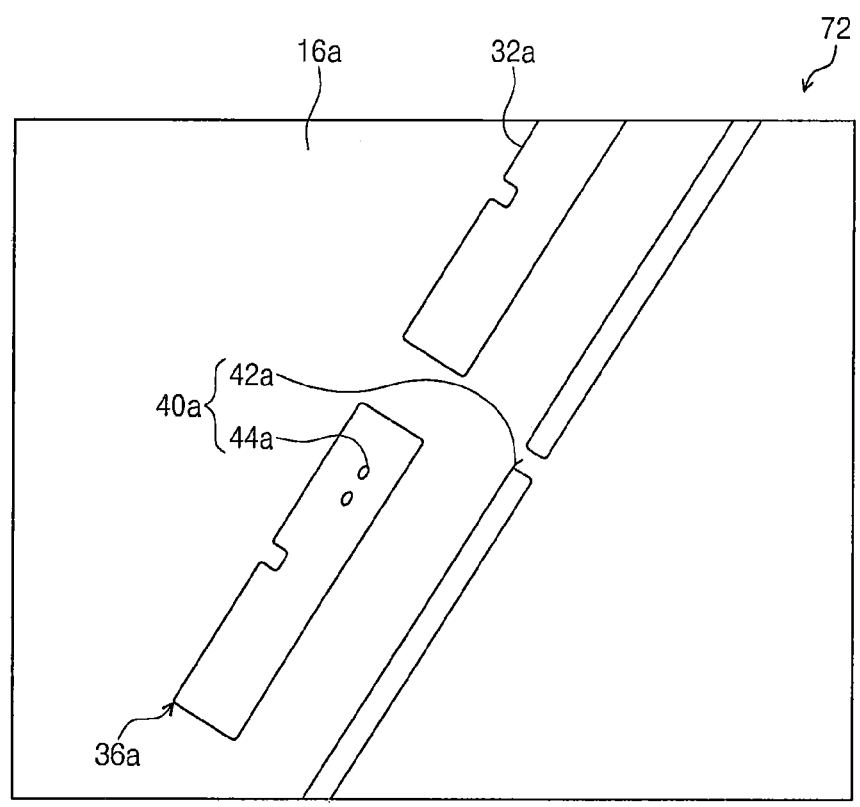
FIGS. 13 to 16 are plan views illustrating a first measured unicolored image and a first target unicolored image in the process of detecting the first hot spot of FIG. 12.

Referring to FIGS. 9, 12, and 13, the first measured unicolored image 72 may be obtained by binarization of the measured image 26 (S222). The measured image 26 may be binarized according to a contrast in intensity. The first measured unicolored image 72 may include a first measured unicolored bare image 16a, a first measured contour line 32a, and the first hot spot 40a. The first measured unicolored bare image 16a may be brighter than the first measured contour line 32a and the first hot spot 40a. The first measured unicolored bare image 16a may correspond to the measured substrate image 16 and the measured inner region 34 of the measured pattern image 30. Alternatively, the first measured unicolored bare image 16a may be darker than the first measured contour line 32a and the first hot spot 40a. The first measured contour line 32a may have a first rounded corner 36a. The first measured contour line 32a may correspond to the measured contour line 32. The first hot spot 40a may correspond to the ghost image 40. The first hot spot 40a may include a first contour hot spot 42a and a first inner hot spot 44a. The first contour hot spot 42a may be disposed on the first measured contour line 32a. The first contour hot spot 42a may correspond to the contour ghost image 42. The first inner hot spot 44a may be disposed inside the first measured contour line 32a. The first inner hot spot 44a may correspond to the inner ghost image 44.

Figure 14:
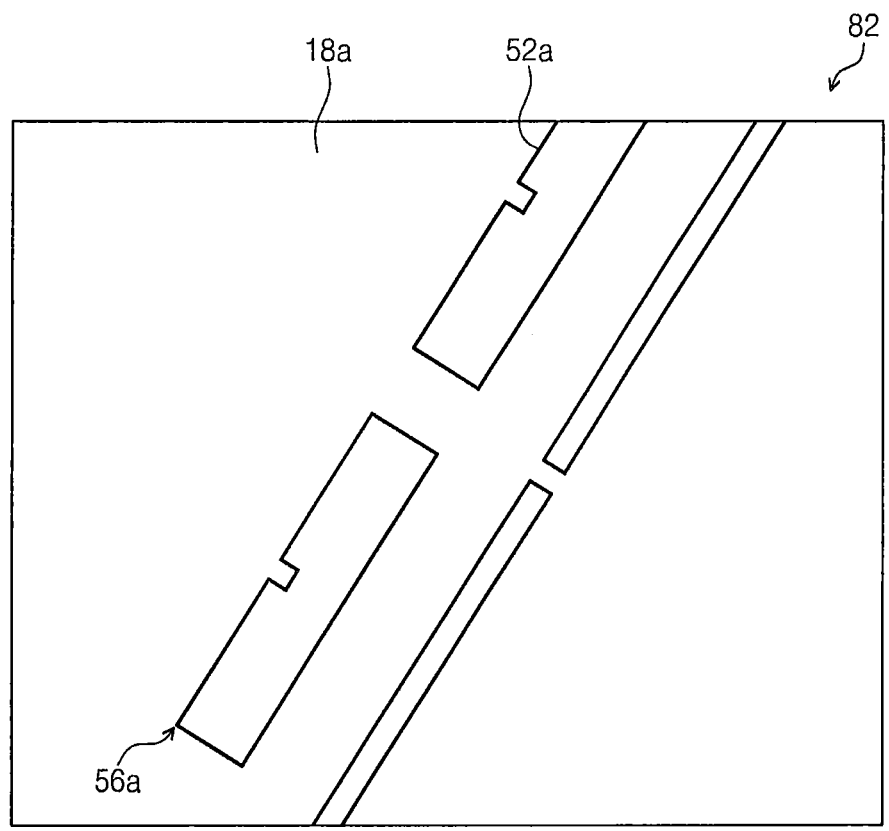

Referring to FIGS. 12 and 14, the first target unicolored image 82 may be obtained by binarization of the target image 28 of FIG. 10 (S222). Alternatively, the first target unicolored image 82 may be provided from the storage part 430. The first target unicolored image 82 may include a first target unicolored bare image 18a and a first target contour line 52a. The first target unicolored bare image 18a may correspond to the target bare image 18 and the target inner region 54 of the target pattern image 50. The first target contour line 52a may have a first angular corner 56a. The first target contour line 52a may correspond to the target contour line 52. A width of the first target contour line 52a may be greater than that of the target contour line 52.

Figure 15:
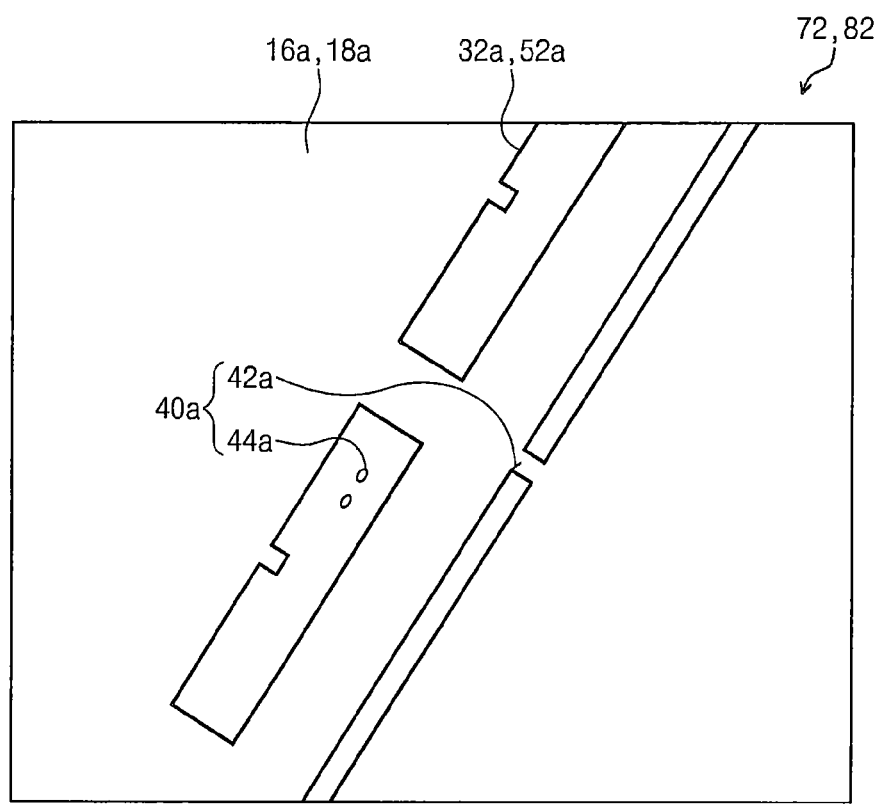

Next, referring to FIGS. 12 and 15, the first measured unicolored image 72 may be overlapped with the first target unicolored image 82 (S224). The first target contour line 52a may block the first measured contour line 32a. The first contour hot spot 42a and the first inner hot spot 44a of the first hot spot 40a may be exposed from the first target contour line 52a.

Thereafter, referring to FIGS. 12 and 16, the control part 420 confirms whether the first measured unicolored image 72 has the first hot spot 40a or not (S226). If the first measured contour line 32a is blocked by the first target contour line 52a, the first hot spot 40a may be represented in the first measured unicolored image 72 without the first measured contour line 32a. Alternatively, if the first hot spot 40a does not exist in the first measured unicolored image 72, the pattern 20 may be determined as a good pattern or defect-free pattern or substantially defect-free pattern by the control part 420.

Referring to FIGS. 12 and 17, the first hot spot 40a may be recorded in the measured image 26 (S228). The first measured unicolored image 72 may correspond to the measured image 26. The first hot spot 40a may be represented on or by the ghost image 40 of the measured image 26. Alternatively, the first hot spot 40a may be represented in the measured image 26 instead of the ghost image 40.

Figure 18:
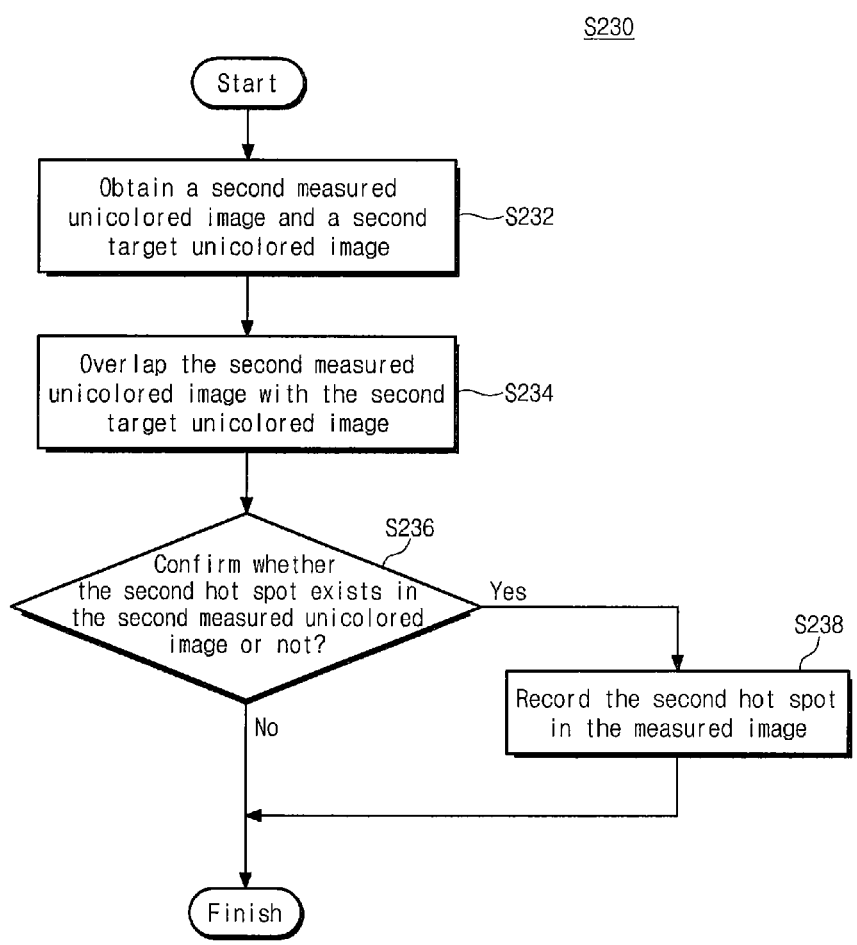
FIG. 18 is a flow chart illustrating a process of detecting a second hot spot of FIG. 11.
Figure 22:
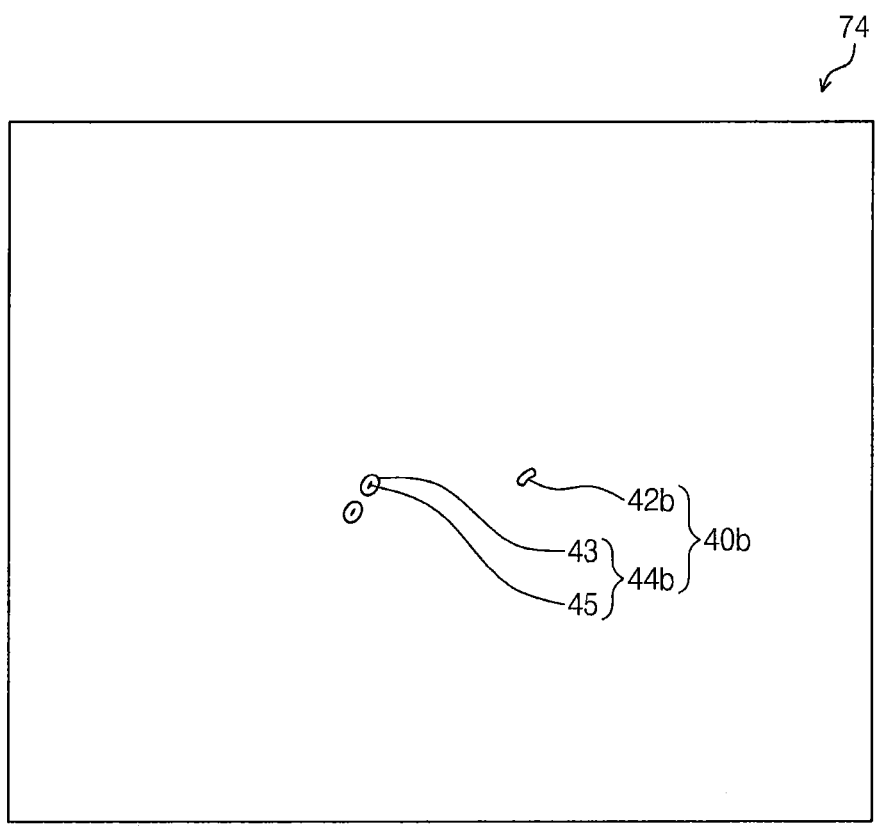
Figure 23:
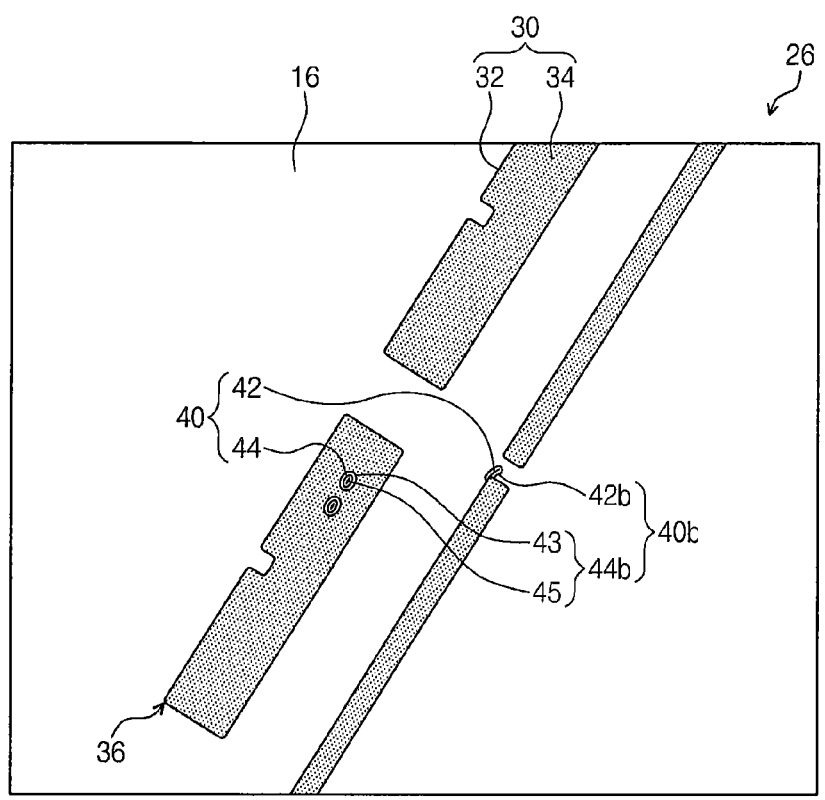
FIG. 23 is a plan view illustrating a measured image in which a second hot spot of FIG. 22 is represented.

FIG. 18 is a flow chart illustrating the process (S230) of detecting a second hot spot of FIG. 11. FIGS. 19 to 22 are plan views illustrating a second measured unicolored image 74 and a second target unicolored image 84 in the process (S230) of detecting the second hot spot 40b of FIG. 18. FIG. 23 is a plan view illustrating a measured image in which a second hot spot 40b of FIG. 22 is represented.

Referring to FIGS. 18 to 22, detecting a second hot spot 40b (S230) may include obtaining a second measured unicolored image 74 and a second target unicolored image 84 (S232), overlapping the second measured unicolored image 74 and the second target unicolored image 84 with each other (S234), confirming the second hot spot 40*b* (S236), and recording the second hot spot 40*a* (S238).

Figure 19:
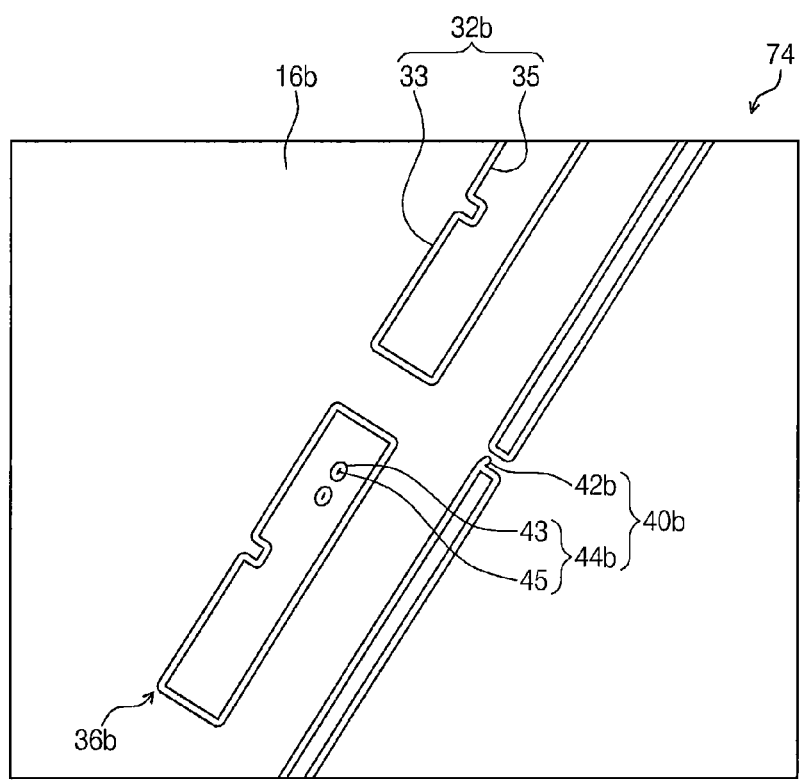
FIGS. 19 to 22 are plan views illustrating a second measured unicolored image and a second target unicolored image in the process of detecting the second hot spot of FIG. 18.

Referring to FIGS. 13, 18, and 19, the second measured unicolored image 74 may be obtained by differentiating the first measured unicolored image 72 with respect to intensity (S232). The second measured unicolored image 74 may include a second measured unicolored bare image 16*b*, second measured contour lines 32*b*, and the second hot spot 40*b*. The second measured unicolored bare image 16*b* may be brighter than the second measured contour lines 32*b* and the second hot spot 40*b*. The second measured unicolored bare image 16*b* may have a smaller area than that of the first measured unicolored bare image 16*a*. Alternatively, the second measured unicolored bare image 16*b* may be darker than the second measured contour lines 32*b* and the second hot spot 40*b*. The second measured contour lines 32*b* may include an outer contour line 33 and an inner contour line 35. The outer contour line 33 and the inner contour line 35 may correspond to an outer edge and an inner edge of the first measured contoured line 32*a*, respectively. A distance between the outer contour line 33 and the inner contour line 35 may be greater than a width of the first measured contour line 32*a*. The inner contour line 35 may be disposed inside the outer contour liner 33. The outer contour line 33 and the inner contour line 35 may have second rounded corners 36*b*. The second hot spot 40*b* may include a second contour hot spot 42*b* and a second inner hot spot 44*b*. The second contour hot spot 42*b* may be disposed on the second measured contour lines 32*b*. The second contour hot spot 42*b* may correspond to the first contour hot spot 42*a*. The second inner hot spot 44*b* may be disposed inside the second measured contour lines 32*b*. The second inner hot spot 44*b* may correspond to the first inner hot spot 44*a*. The second inner hot spot 44*b* may include an external hot spot 43 and an internal hot spot 45. The internal hot spot 45 may be disposed inside the external hot spot 43. The internal hot spot 45 may be smaller than the first inner hot spot 44*a* (or an area of the internal hot spot 45 may be smaller than an area of the first inner hot spot 44*a*), and the external hot spot 43 may be greater than the first inner hot spot 44*a* (or an area of the external hot spot 43 may be greater than an area of the first inner hot spot 44*a*).

Figure 20:
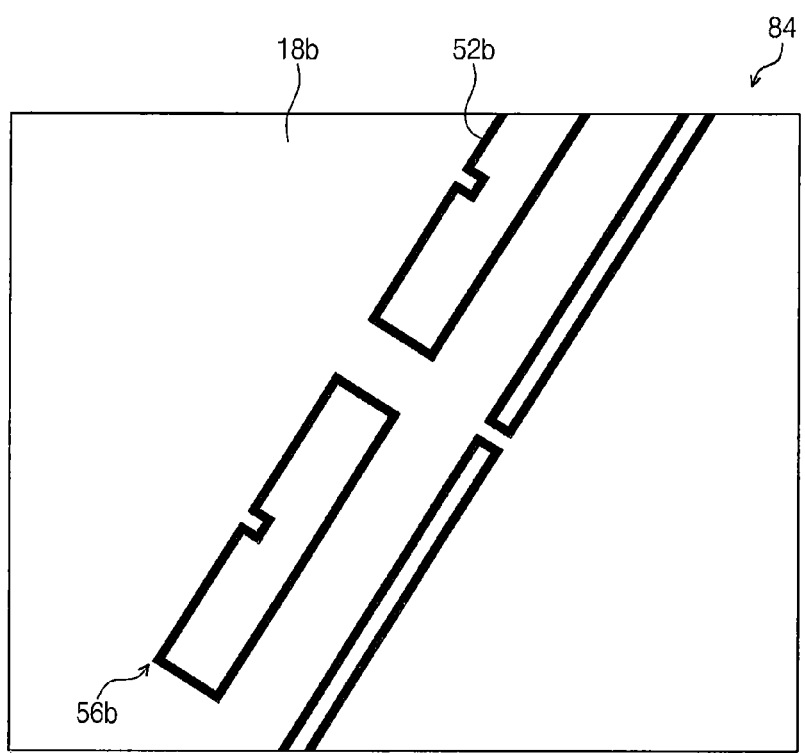

Referring to FIGS. 14, 18 and 20, the second target unicolored image 84 may be obtained by dilatation of the first target unicolored image 82 (S232). Alternatively, the second target unicolored image 84 may be provided from the storage part 430. The second target unicolored image 84 may include a second target unicolored bare image 18*b* and a second target contour line 52*b*. The second target unicolored bare image 18*b* may have a smaller area than the first target unicolored bare image 18*a*. The second target contour line 52*b* may be wider or have a wider area than the first target contour line 52*a*. The second target contour line 52*b* may have a second angular corner 56*b*.

Figure 21:
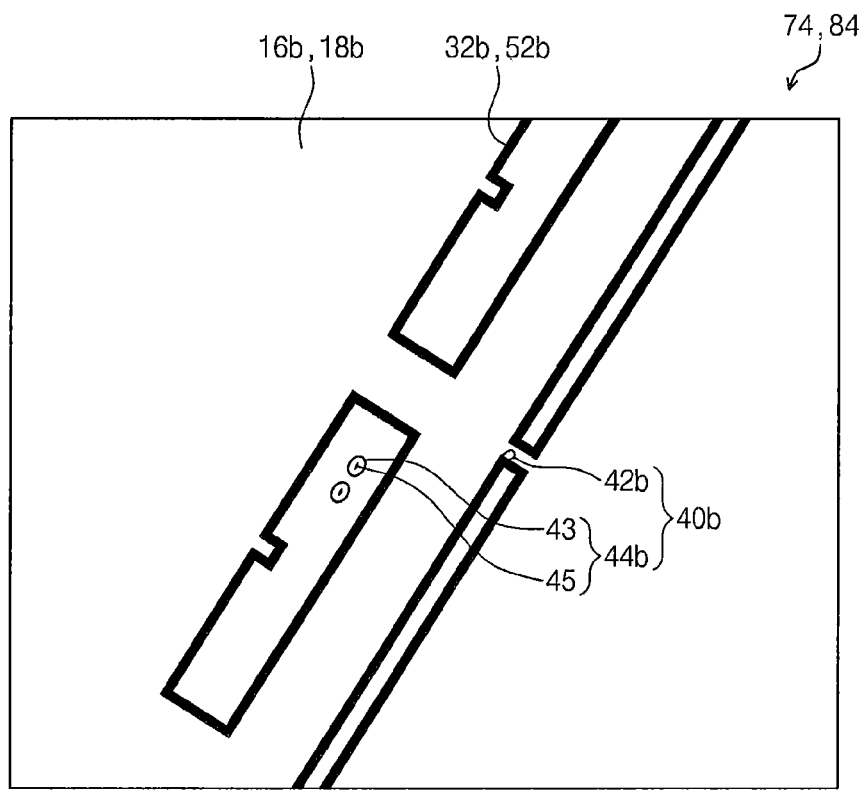

Next, referring to FIGS. 18 and 21, the second measured unicolored image 74 may be overlapped with the second target unicolored image 84 (S234). The second target contour line 52*b* may block the second measured contour lines 32*b*. The second contour hot spot 42*b* and the second inner hot spot 44*b* may be exposed from the second target contour line 52*b*.

Thereafter, referring to FIGS. 18 and 22, the control part 420 may confirm whether the second measured unicolored image 74 has the second hot spot 40*b* or not (S236). If the second measured contour lines 32*b* are blocked by the second target contour line 52*b*, the second hot spot 40*b* may be represented in the second measured unicolored image 74 without the second measured contour lines 32*b*. Alternatively, if the second hot spot 40*b* does not exist in the second measured unicolored image 74, the pattern 20 may be determined as a good pattern or defect-free pattern or substantially defect-free pattern by the control part 420.

Referring to FIGS. 18 and 23, the second hot spot 40*b* may be recorded in the measured image 26 (S238). The second measured unicolored image 74 may correspond to the measured image 26. The second hot spot 40*b* may be represented on or by the ghost image 40 of the measured image 26. Alternatively, the second hot spot 40*b* may be represented in the measured image 26 instead of the ghost image 40. An area of the second inner hot spot 44*b* represented in the measured image 26 may be wider than that of the ghost image 44. If the area of the second contour hot spot 42*b* or the second inner hot spot 44*b* is equal to or greater than a predetermined area, the control part 420 may judge that the defect occurs on the pattern 20 (S30).

Figure 24:
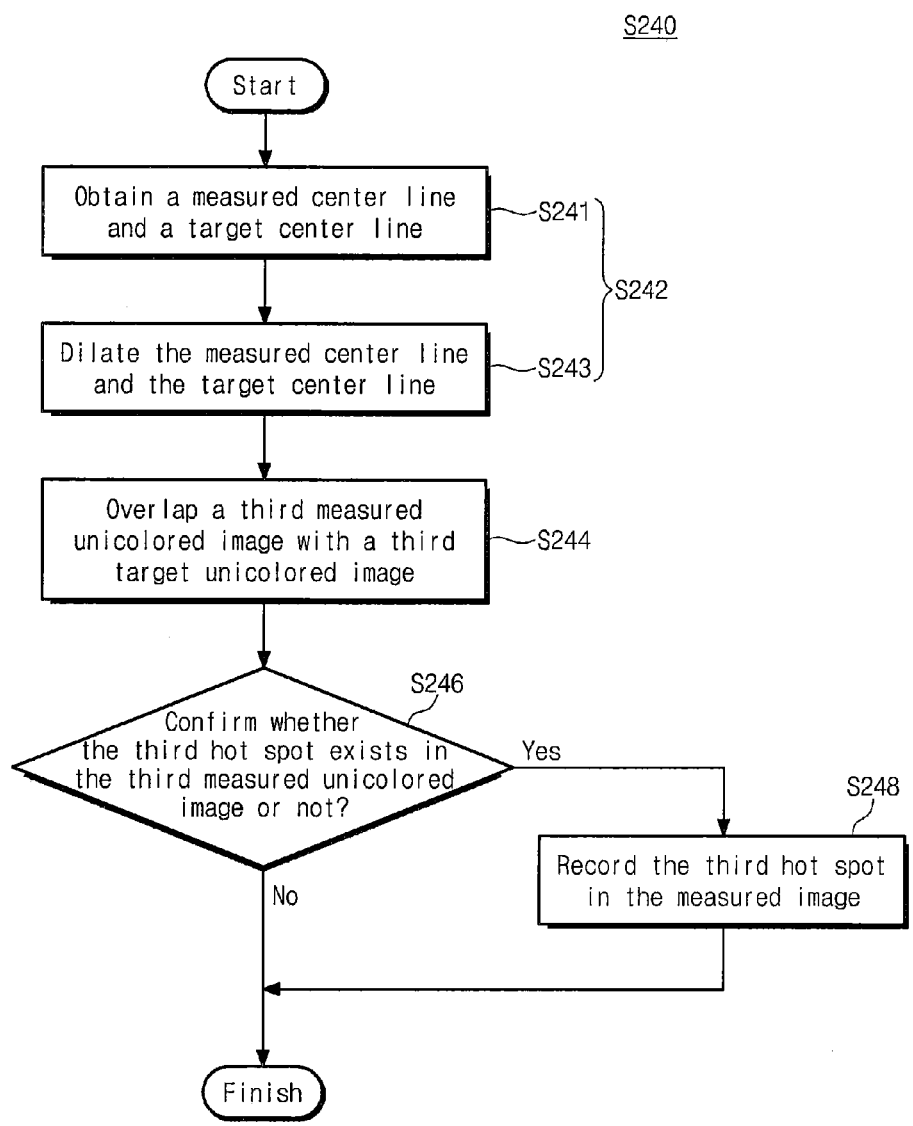
FIG. 24 is a flow chart illustrating a process of detecting a third hot spot of FIG. 11.
Figure 30:
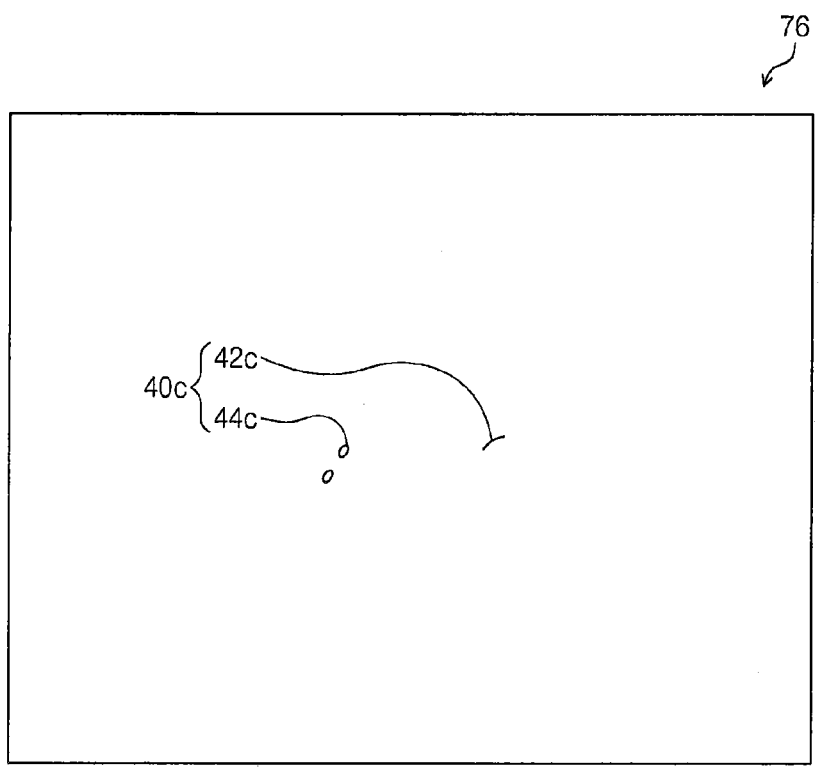
Figure 31:
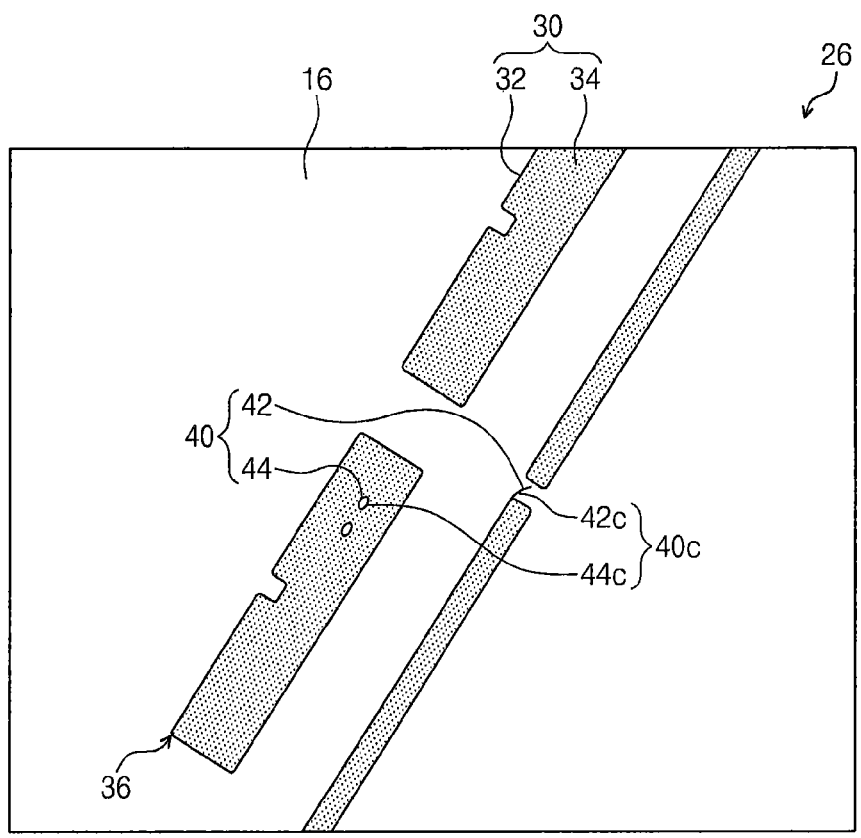
FIG. 31 is a plan view illustrating a measured image in which a third hot spot of FIG. 30 is represented.

FIG. 24 is a flow chart illustrating the process (S240) of detecting the third hot spot of FIG. 11. FIGS. 25 to 30 are plan views illustrating a third measured unicolored image 76 and a third target unicolored image 86 in the process of detecting the third hot spot of FIG. 24. FIG. 31 is a plan view illustrating a measured image 26 in which a third hot spot 40*c* of FIG. 30 is represented.

Referring to FIGS. 24 to 30, detecting a third hot spot 40*c* (S240) may include obtaining a third measured unicolored image 76 and a third target unicolored image 86 (S242), overlapping the third measured unicolored image 76 and the third target unicolored image 86 with each other (S244), confirming the third hot spot 40*c* (S246), and recording the third hot spot 40*c* (S248). Obtaining the third measured unicolored image 76 and the third target unicolored image 86 (S242) may include obtaining a measured center line 60 and a target center line (S241) and dilating the measured center line 60 (S243).

Figure 25:
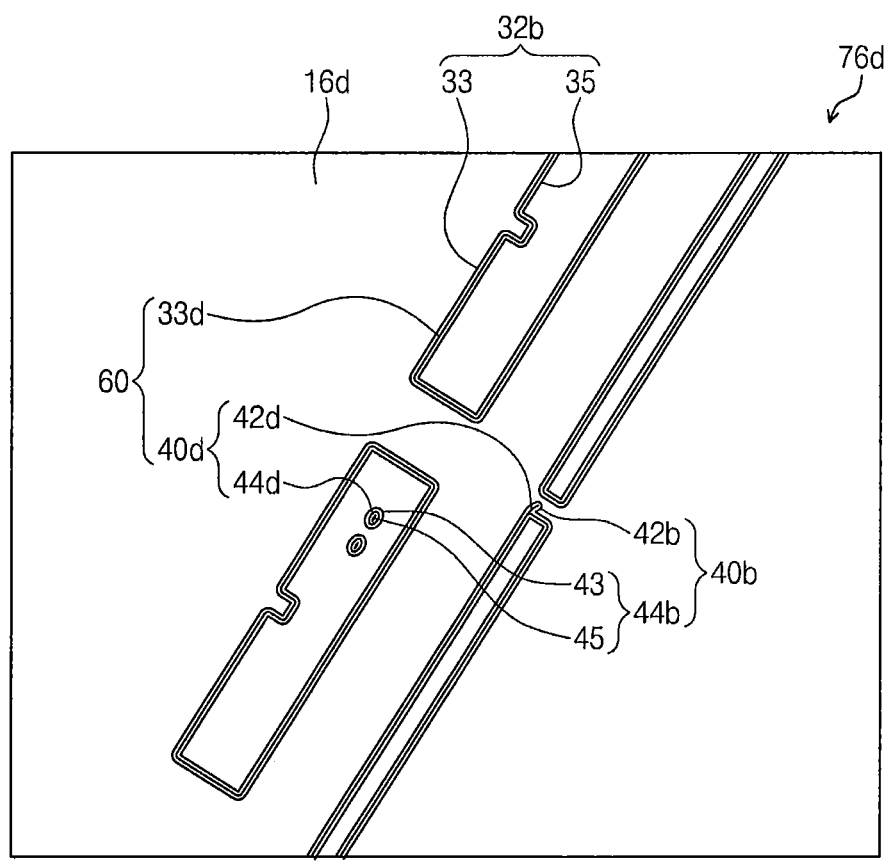
FIGS. 25 to 30 are plan views illustrating a third measured unicolored image and a third target unicolored image in the process of detecting the third hot spot of FIG. 24.

Referring to FIGS. 19, 24, and 25, a dummy measured unicolored image 76*d* may include a dummy measured unicolored bare image 16*d*, the second measured contour lines 32*b*, the second hot spot 40*b*, and the measured center line 60. The second measured contour lines 32*b* and the second hot spot 40*b* are the same as described with reference to FIG. 19. The dummy measured unicolored bare image 16*d* may correspond to the second measured unicolored bare image 16*b*. The measured center line 60 may be obtained by centers of the second hot spot 40*b* and the second measured contour lines 32*b* (S241). The measured center line 60 may include a contour center line 33*d* and a hot spot center line 40*d*. The contour center line 33*d* may be disposed at a center between the outer contour line 33 and the inner contour line 35. The hot spot center line 40*d* may include a contour hot spot center line 42*d* and an inner hot spot center line 44*d*. The contour hot spot center line 42*d* may be disposed at a center between the edges of the second measured contour lines 32*b*. The inner hot spot center line 44*d* may be disposed at a center between the external hot spot 43 and the internal hot spot 45.

Figure 26:
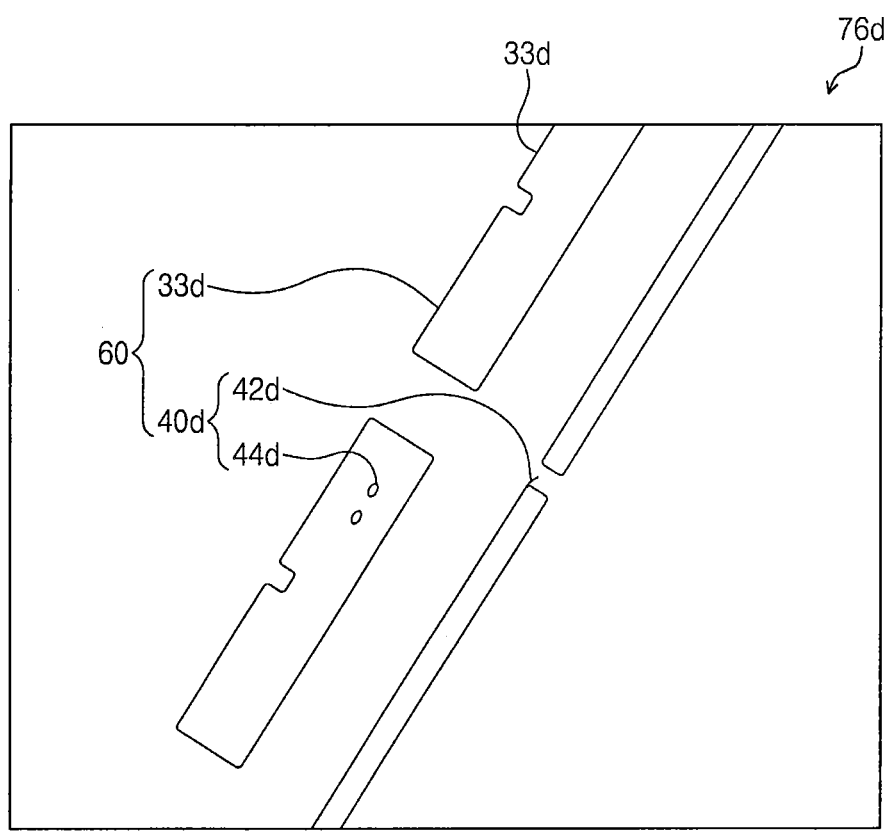

Referring to FIGS. 19 and 26, the second measured contour lines 32*b* and the second hot spot 40*b* may be blocked by the second measured unicolored image 74. The measured center line 60 may be represented in the dummy measured unicolored image 76*d* without the second measured contour lines 32*b* and the second hot spot 40*b*.

Figure 27:
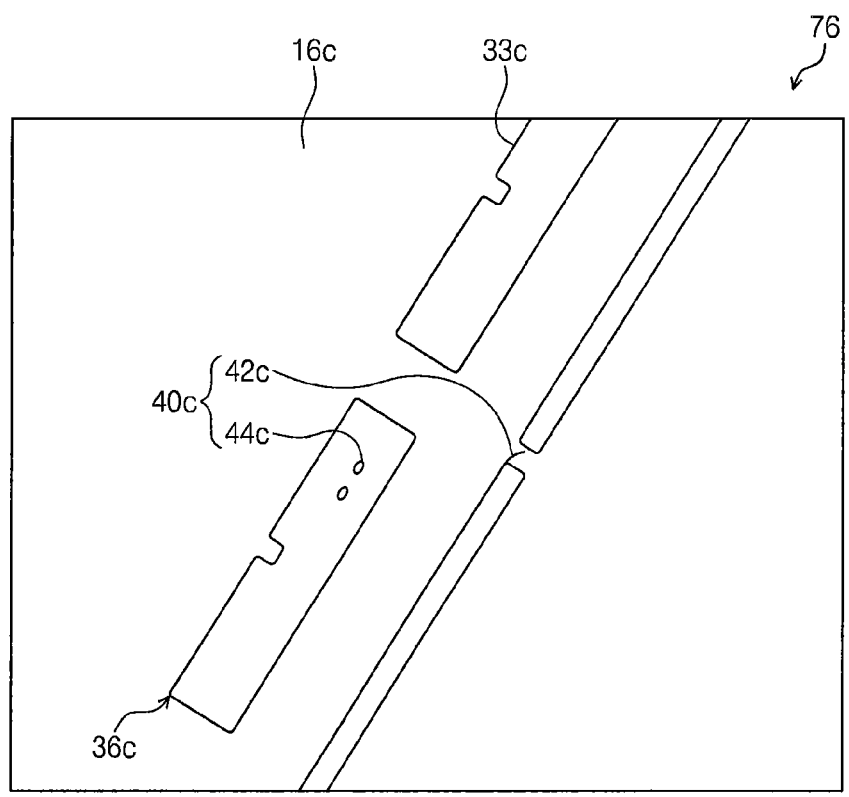
Figure 28:
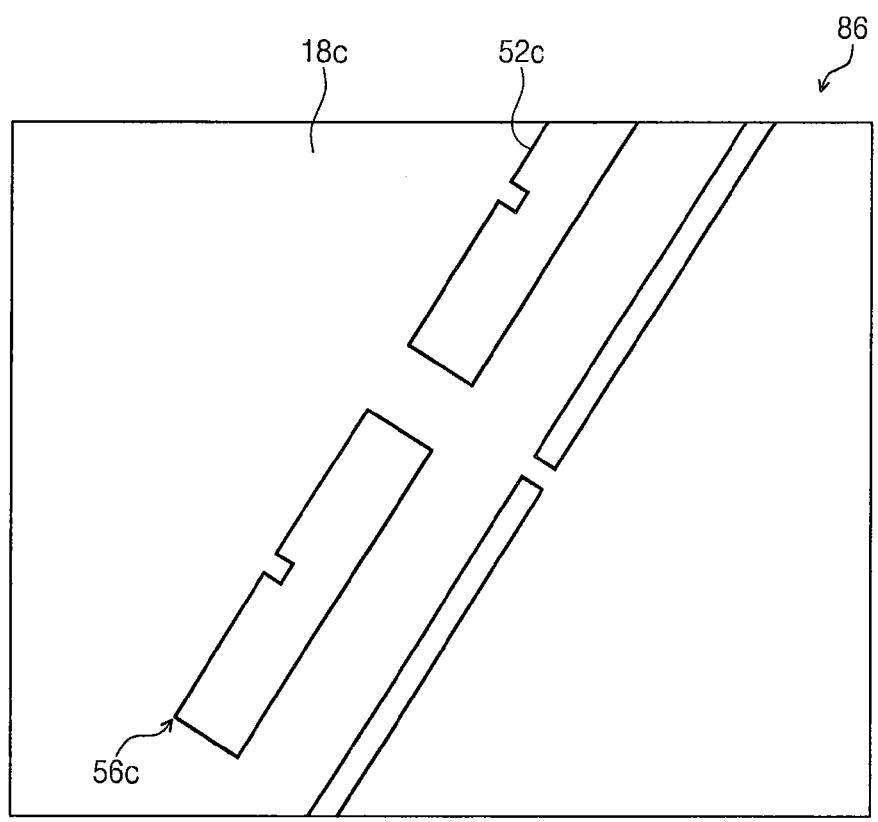

Thereafter, referring to FIGS. 24, 26, and 27, the measured center line 60 may be dilated in a width direction and a longitudinal direction (S243) to obtain the third measured unicolored image 76 (S242). The third measured unicolored image 76 may include a third measured unicolored bare image 16c, a third measured contour line 32c, and the third hot spot 40c. The third measured unicolored bare image 16c may be smaller than the dummy measured unicolored bare image 16d. The third measured contour line 32c may be obtained by dilating the contour center line 33d. The third measured contour line 32c may have a third angular or rounded corner 36c. The third hot spot 40c may be obtained by dilating the hot spot center line 40d. The third hot spot 40c may include a third contour hot spot 42c and a third inner hot spot 44c. The third contour hot spot 42c may be obtained by dilating the contour hot spot center line 42d. The contour hot spot center line 42d may have the same length as the first contour hot spot 42a and the second contour hot spot 42b. The contour hot spot center line 42d may be dilated in the longitudinal direction as well as the width direction. Thus, the third contour hot spot 42c may be longer than the contour hot spot center line 42d, the first contour hot spot 42a, and the second contour hot spot 42b.

Referring to FIGS. 14, 20, 24, and 28, the third target unicolored image 86 may be obtained from the first target unicolored image 82 or the second target unicolored image 84 (S242). The third target unicolored image 86 may include a third target unicolored bare image 18c and a third target contour line 52c. The third target unicolored image 86 may be the same as the first target unicolored image 82 or the second target unicolored image 84. The third target unicolored bare image 18c may be the same as the first target unicolored bare image 18a or the second target unicolored bare image 18b. The third target contour line 52c may have a third angular corner 56c. The third target contour line 52c may be the same as the first target contour line 52a or the second target contour line 52b. This is because the third target contour line 52c is calculated again from the first target contour line 52a or the second target contour line 52b if a center line within the first target contour line 52a or the second target contour line 52b is obtained and then dilated. Alternatively, the third target unicolored image 86 may be provided from the storage part 430.

Figure 29:
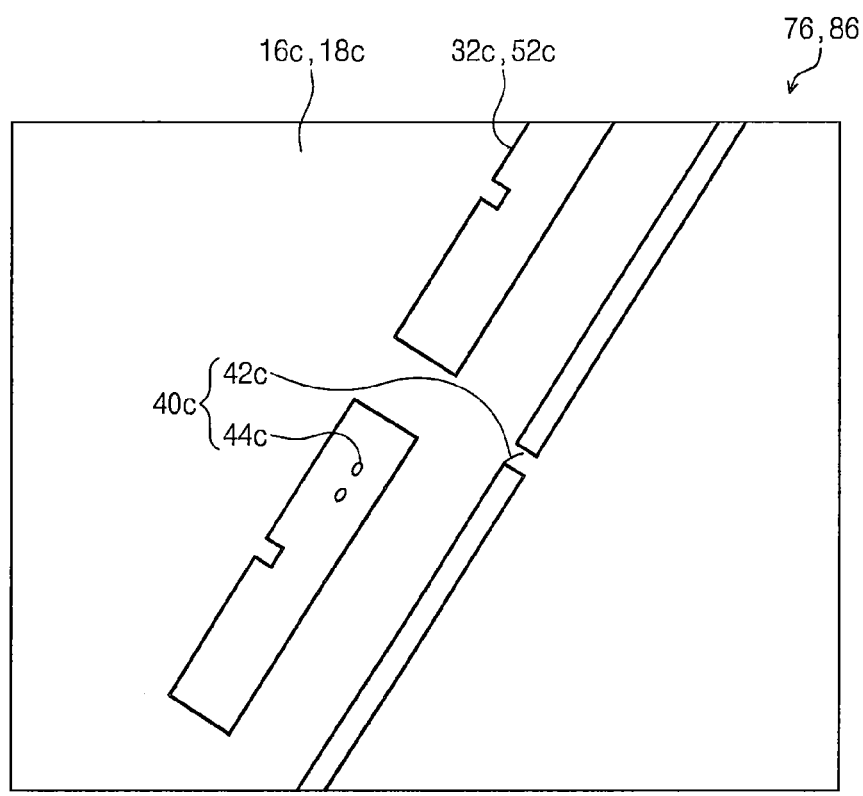

Referring to FIGS. 24 and 29, the third measured unicolored image 76 may be overlapped with the third target unicolored image 86 (S244). The third measured contour line 32c may be blocked by the third target contour line 52c. The third hot spot 40c may be exposed from the third target contour line 52c.

Referring to FIGS. 24 and 30, the control part 420 of FIG. 7 confirms whether the third hot spot 40c exists in the third measured unicolored image 76 or not (S246). If the third measured contour line 32c is blocked by the third target contour line 52c, the third hot spot 40c may be represented in the third measured unicolored image 76 without the third measured contour line 32c. Alternatively, if the third hot spot 40c does not exist in the third measured unicolored image 76, the pattern 20 may be determined as a good pattern or defect-free pattern or substantially defect-free pattern by the control part 420.

Referring to FIGS. 24 and 31, the third hot spot 40c may be recorded in the measured image 26 (S248). The third measured unicolored image 76 may correspond to the measured image 26. The third hot spot 40c may be represented on or by the ghost image 40 of the measured image 26. Alternatively, the third hot spot 40c may be represented in the measured image 26 instead of the ghost image 40. The third contour hot spot 42c represented in the measured image 26 may be longer than the contour ghost image 42. If the length of the third contour hot spot 42c is equal to or greater than a predetermined length, the control part 420 may judge that the defect occurs on the pattern 20 (S30).

Figure 32:
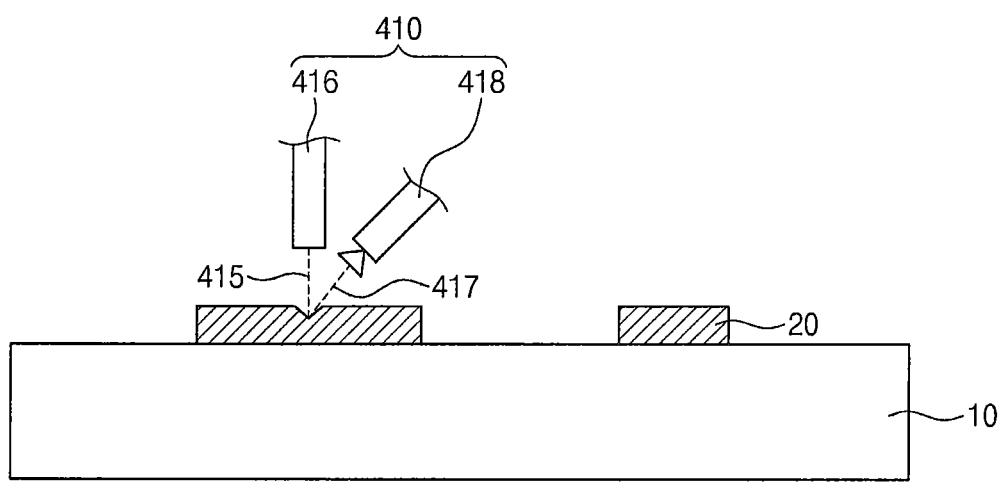
FIG. 32 is a side view illustrating another embodiment of a measurement part of the inspection unit of FIG. 7.

FIG. 32 is a side view illustrating another embodiment of a measurement part 410 of FIG. 7.

Referring to FIGS. 7 and 32, a measurement part 410 may include an optical microscope. In some embodiments, the measurement part 410 may include a lighting unit 416 and a camera 418. The lighting unit 416 may provide incident light 415 to the substrate 10 and the pattern 20. The camera 418 may detect light 417 reflected from the substrate 10 and the pattern 20. Even though not shown in the drawings, the camera 418 may have a lens magnifying the pattern 20. The lighting unit 416 may be disposed in a direction perpendicular to the substrate 10, so a shadow may not occur. In addition, the lighting unit 416 may provide the incident light 415 on an entire top surface of the substrate 10. Alternatively, the incident 415 and the reflected light 417 may travel in the direction perpendicular to the substrate 10 by an optical system (not shown). The control part 420 may obtain a multi-colored image of the substrate 10 and the pattern 20 according to a wavelength of the reflected light 417 detected by the camera 418. The display part 440 may display the multi-colored image of the substrate 10 and the pattern 20. For example, the display part 440 may display the image of the substrate 10 and pattern 20 with about 256 colors.

Figure 33:
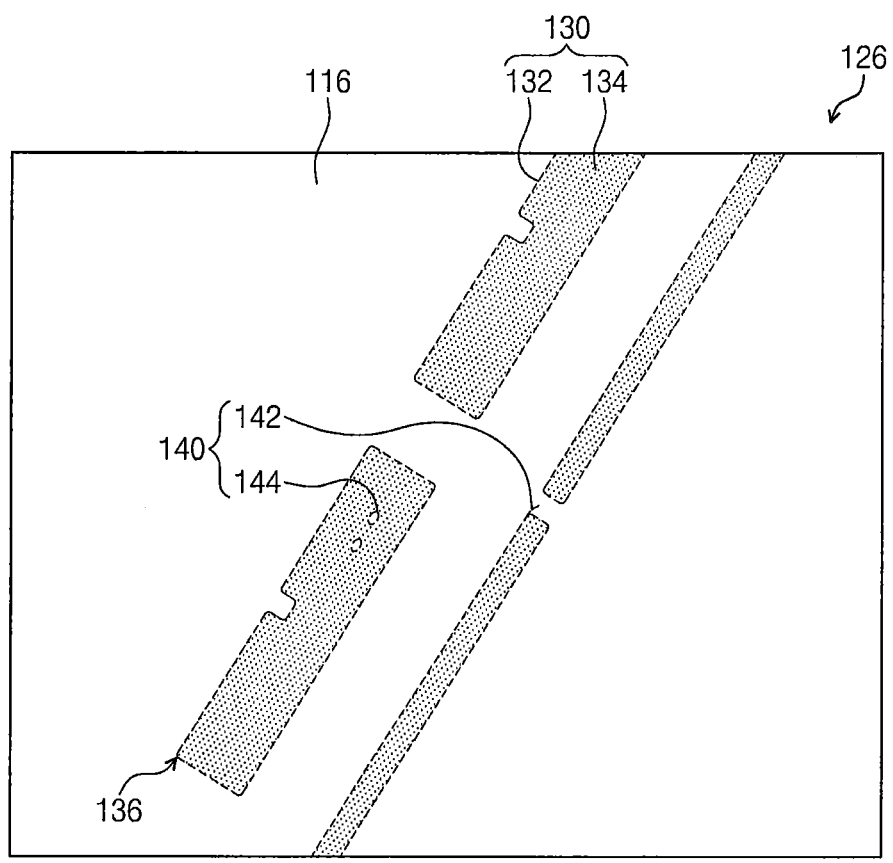
FIG. 33 is a plan view illustrating a measured image obtained by a camera of the measurement part of FIG. 32.

FIG. 33 is a plan view illustrating a measured image 126 obtained by a camera of FIG. 32.

Referring to FIGS. 11 and 33, in the measured image 126, a measured substrate image 116 may be shown more brightly than a measured pattern image 130 and a ghost image 140. The measured substrate image 116 may correspond to a measured bare region. Alternatively, the measured substrate image 116 may be shown more darkly than the measured pattern image 130 and the ghost image 140. A measured contour line 132 of the measured pattern image 130 may not be as clear as a measured inner region 134 of the measured pattern image 130. This is because the measurement part 410 detects the measured image 126 without a shadow of the pattern 20. Likewise, the ghost image 140 may not be as clear as the measured inner region 134. A contour ghost image 142 and an inner ghost image 144 may have a small contrast in intensity with respect to the measured inner region 134. The contour ghost image 142 may be hardly shown at a rounded corner 136 of the measured contour line 132. The control part 420 may not directly confirm the ghost image 140. Thus, the control part 420 may confirm a defect of the pattern 20 by means of the process (S20) of the inspecting the pattern 20 of FIG. 11. Inspecting the pattern 20 (S20) may include obtaining the measured image 126 (S210), detecting first to third hot spots (S220 to S240), and determining whether the detection of the first to third hot spots is finished or not (S250).

Referring to FIGS. 12 to 17, detecting a first hot spot 40a (S220) may include obtaining a first measured unicolored image 72 and a first target unicolored image 82 (S222), overlapping the first measured unicolored image 72 and the first target unicolored image 82 with each other (S224), confirming the first hot spot 40a (S226), and recording the first hot spot 40a (S228).

Referring again to FIGS. 12, 13, and 33, the first measured unicolored image 72 may be obtained by differentiating the measured image 126 with respect to intensity (S222). When a contrast in intensity of the measured image 126 exists, the first measured unicolored image 72 may have a differential value, not 0 (zero). The first measured unicolored image 72 may include a first measured unicolored bare image 16a, a first measured contour line 32a, and the first hot spot 40a.

The first measured contour line 32a may correspond to a boundary between the measured substrate image 116 and the measured inner region 134. In other words, the first measured contour line 32a may correspond to the measured contour line 132. The first measured contour line 32a may be shown more clearly than the measured contour line 132. This may be because the measured inner region 134 is not shown in the measured unicolored image 72. The first target unicolored image 82 may be obtained by binarization of the target image 28 (S222).

Referring to FIGS. 12, 15, and 16, the first measured unicolored image 72 may be overlapped with the first target unicolored image 82 (S224). Whether the first hot spot 40a exists in the first measured unicolored image 72 or not may be confirmed (S226).

Figure 34:
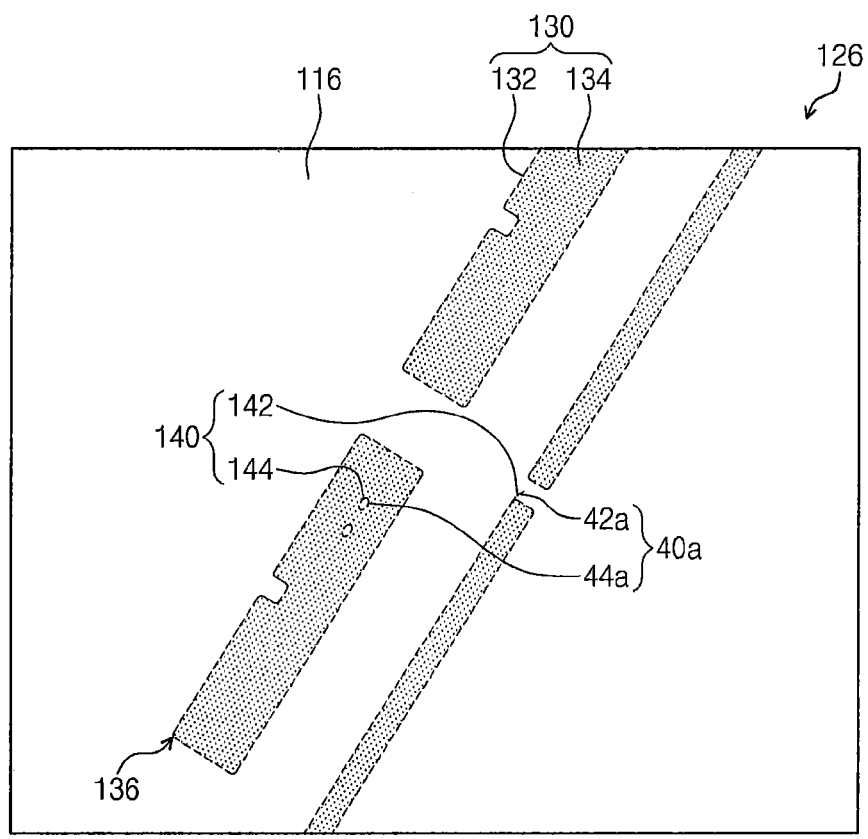
FIG. 34 is a plan view illustrating the measured image in which the first hot spot of FIG. 16 is represented.

FIG. 34 is a plan view illustrating the measured image 126 in which the first hot spot 40a of FIG. 16 is represented.

Referring to FIGS. 12, 16, and 34, when the first hot spot 40a exists in the first measured unicolored image 72, the first hot spot 40a may be recorded in the measured image 126 (S228). The first measured unicolored image 72 may correspond to the measured image 126. The first hot spot 40a may be represented on or by the ghost image 140 of the measured image 126. Alternatively, the first hot spot 40a may be represented in the measured image 126 instead of the ghost image 140.

If the first hot spot 40a does not exist in the first measured unicolored image 72, the pattern 20 may be determined as a good pattern or defect-free pattern or substantially defect-free pattern by the control part 420.

Referring to FIGS. 18 to 23, detecting the second hot spot 40b (S230) may include obtaining a second measured unicolored image 74 and a second target unicolored image 84 (S232), overlapping the second measured unicolored image 74 and the second target unicolored image 84 with each other (S234), confirming the second hot spot 40b (S236), and recording the second hot spot 40a (S238).

The second measured unicolored image 74 may be obtained by differentiating the first measured unicolored image 72 with respect to intensity (S232). The second target unicolored image 84 may be obtained by dilatation of the first target unicolored image 82 (S232).

Referring to FIGS. 18 and 21, the second measured unicolored image 74 may be overlapped with the second target unicolored image 84 (S234).

Referring to FIGS. 18 and 22, whether the second hot spot 40b exists in the second measured unicolored image 74 or not may be confirmed (S236).

Figure 35:
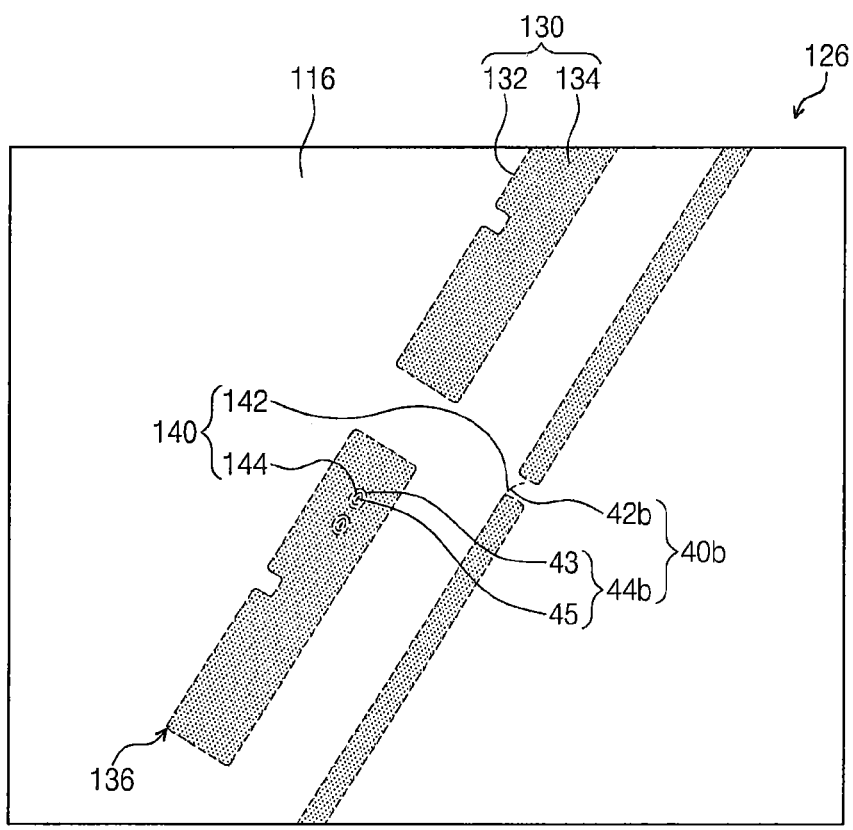
FIG. 35 is a plan view illustrating the measured image in which the second hot spot of FIG. 22 is represented.

FIG. 35 is a plan view illustrating the measured image 126 in which the second hot spot 40b of FIG. 22 is represented.

Referring to FIGS. 18, 22, and 35, when the second hot spot 40b exists in the second measured unicolored image 74, the second hot spot 40b may be recorded in the measured image 126 (S238). The second measured unicolored image 74 may correspond to the measured image 126. The second hot spot 40b may be represented on or by the ghost image 140 of the measured image 126. If the area of the second contour, hot spot 42b or the second inner hot spot 44b is equal to or greater than a predetermined area, the control part 420 may judge that the defect occurs on the pattern 20 (S30).

Alternatively, if the second hot spot 40b does not exist in the second measured unicolored image 74, the pattern 20 may be determined as a good pattern or defect-free pattern or substantially defect-free pattern by the control part 420.

Referring to FIGS. 24 to 31, detecting the third hot spot 40c (S240) may include obtaining a third measured unicolored image 76 (S242) and a third target unicolored image 86 (S242), overlapping the third measured unicolored image 76 and the third target unicolored image 86 with each other (S244), confirming the second hot spot 40c (S246), and recording the third hot spot 40c (S248). Obtaining the third measured unicolored image 76 and the third target unicolored image 86 (S242) may include obtaining the measured center line 60 and a target center line (not shown) (S241) and dilating the measured center line 60 (S243).

Referring to FIGS. 24 to 28, the measured center line 60 may be obtained by centers of the second hot spot 40b and the second measured contour lines 32b (S241). The measured center line 60 may be dilated in a width direction and a longitudinal direction (S243) to obtain the third measured unicolored image 76 (S242). The third target unicolored image 86 may be obtained from the first target unicolored image 82 or the second target unicolored image 84 (S242).

Referring to FIGS. 24 and 29, the third measured unicolored image 76 may be overlapped with the third target unicolored image 86 (S244).

Referring to FIGS. 24 and 30, whether the third hot spot 40c exists in the third measured unicolored image 76 or not may be confirmed (S246).

Figure 36:
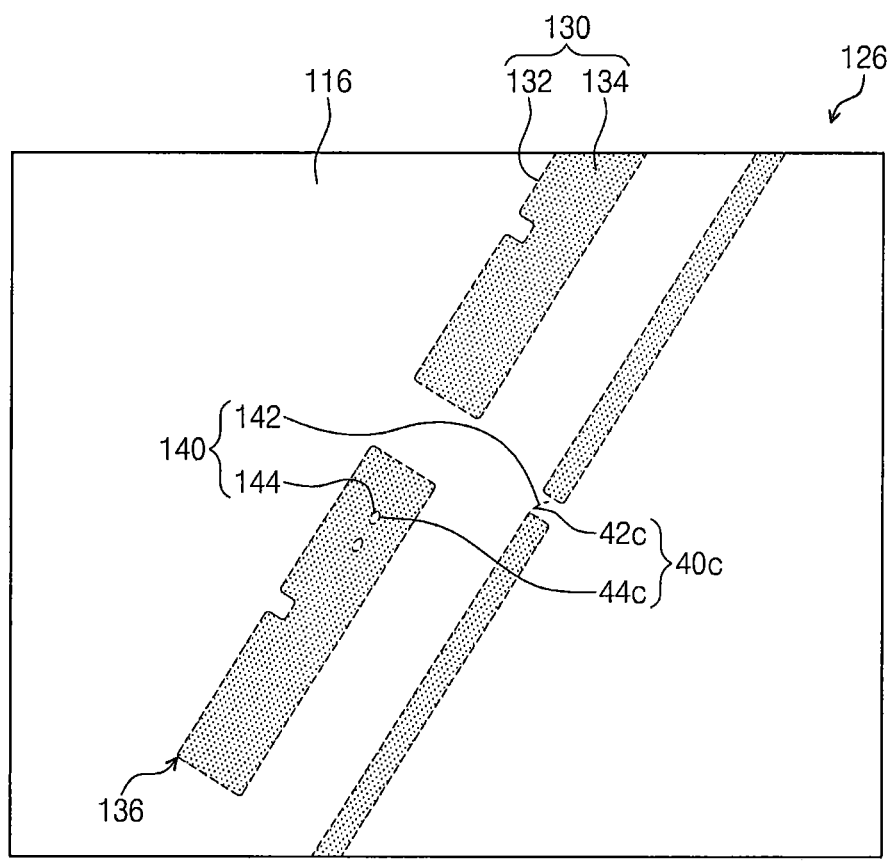
FIG. 36 is a plan view illustrating the measured image in which the third hot spot of FIG. 30 is represented.

FIG. 36 is a plan view illustrating the measured image 126 in which the third hot spot 40c of FIG. 30 is represented.

Referring to FIGS. 24, 30, and 36, if the third hot spot 40c exists in the third measured unicolored image 76, the third hot spot 40c may be recorded in the measured image 126 (S248). The third measured unicolored image 76 may correspond to the measured image 126. The third hot spot 40c may be represented on or by the ghost image 140 of the measured image 126. The third contour hot spot 42c may be shown longer than the contour ghost image 142. If the length of the third contour hot spot 42c is equal to or greater than a predetermined length, the control part 420 may judge that the defect occurs on the pattern 20 (S30).

Alternatively, if the third hot spot 40c does not exist in the third measured unicolored image 76, the pattern 20 may be determined as a good pattern or defect-free pattern or substantially defect-free pattern by the control part 420.

As described above, the method for inspecting the pattern according to the inventive concepts may include blocking the measured contour line with the target contour line to detect the hot spot, and recording the hot spot on the ghost image of the measured image. Thus, the defect of the pattern may be automatically inspected.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for inspecting a pattern, the method comprising:
   detecting a measured image corresponding to a pattern formed on a substrate;
   detecting a first hot spot corresponding to a ghost image of the measured image, the ghost image representing a defect of the pattern; and
   detecting a second hot spot that has an area that is wider than an area of the first hot spot, wherein detecting the first hot spot comprises obtaining a first measured unicolored image including a first measured contour line by binarizing the measured image or by differentiating the measured image with respect to intensity, wherein detecting the second hot spot comprises obtaining a second measured unicolored image including a plurality of second measured contour lines by differentiating the first measured unicolored image with respect to intensity, and wherein the second measured contour lines correspond to an inside and an outside of the first measured contour line.

2. The method of claim 1, wherein detecting the first hot spot further comprises:

overlapping the first measured unicolored image with a first target unicolored image;

confirming whether the first hot spot exists in the first measured unicolored image; and recording the first hot spot on the ghost image if the first hot spot exists in the first measured unicolored image.

3. The method of claim 2, wherein the first target unicolored image includes a first target contour line, and wherein overlapping the first measured unicolored image with the first target unicolored image comprises blocking the first measured contour line with the first target contour line.

4. The method of claim 1, wherein detecting the second hot spot further comprises:

overlapping the second measured unicolored image with a second target unicolored image;

confirming whether the second hot spot exists in the second measured unicolored image; and recording the second hot spot on the ghost image if the second hot spot exists in the second measured unicolored image.

5. The method of claim 4, wherein the second target unicolored image includes a second target contour line, and wherein overlapping the second measured unicolored image with the second target unicolored image comprises blocking the second measured contour lines with the second target contour line.

6. The method of claim 5, further comprising:

detecting a third hot spot that has a length that is longer than a length of the second hot spot.

7. The method of claim 6, wherein detecting the third hot spot comprises:

obtaining a dummy measured unicolored image including a contour center line disposed between the second measured contour lines;

dilating the contour center line to obtain a third measured unicolored image including a third measured contour line;

overlapping the third measured unicolored image with a third target unicolored image;

confirming whether the third hot spot exists in the third measured unicolored image; and recording the third hot spot on the ghost image if the third hot spot exists in the third measured unicolored image.

8. The method of claim 7, wherein the third target unicolored image includes a third target contour line, and wherein overlapping the third measured unicolored image with the third target unicolored image comprises blocking the third measured contour line with the third target contour line.

9. An apparatus for manufacturing a semiconductor device, the apparatus comprising:

a spinner configured to form a photoresist on a substrate;

an exposure unit disposed at a side of the spinner, the exposure unit configured to provide light used for exposing the photoresist; and an inspection unit disposed at another side of the spinner, the inspection unit configured to inspect a defect of the photoresist, wherein the inspection unit comprises:

a measurement part configured to measure the photoresist and the substrate to obtain a measured image; and a control part configured to control the measurement part to detect a first hot spot and a second hot spot, wherein the first hot spot corresponds to a ghost image of the measured image, which represents a defect of the photoresist, and wherein an area of the second hot spot is wider than an area of the first hot spot, wherein the measurement part includes a scanning electron microscope that is configured to detect secondary electrons generated by an electron beam provided to the substrate and a pattern of the photoresist to obtain the measured image including a contour line of a measured pattern image, wherein the control part is configured to obtain a first measured unicolored image including a first measured contour line corresponding to the contour line by binarizing the measured image, wherein the control part is configured to detect the first hot spot in the first measured unicolored image, wherein the control part is configured to obtain a second measured unicolored image including a plurality of second measured contour lines by differentiating the first measured unicolored image, wherein the control part is configured to detect the second hot spot in the second measured unicolored image, and wherein the second measured contour lines correspond to an inside and an outside of the first measured contour line.

10. The apparatus of claim 9, wherein the inspection unit further comprises a storage part configured to store a first target image including a first target contour line corresponding to the first measured contour line, wherein the control part is configured to block the first measured contour line with the first target contour line to detect the first hot spot in the first measured unicolored image, and wherein the control part is configured to record the first hot spot on the ghost image.

11. The apparatus of claim 10, wherein the storage part is configured to store a second target image including a second target contour line corresponding to the second measured contour lines, wherein the control part is configured to block the second measured contour lines with the second target contour line to detect the second hot spot in the second measured unicolored image, and wherein the control part is configured to record the second hot spot on the ghost image to confirm whether the photoresist is substantially defect-free or not according to a size of the second hot spot.

12. The apparatus of claim 11, wherein the storage part is configured to store a third target image including a third target contour line, wherein the control part is configured to obtain a third measured unicolored image including a third measured contour line obtained by dilating a center line disposed between the second measured contour lines, wherein the control part is configured to block the third measured contour line with the third target contour line to detect a third hot spot, and wherein the control part is configured to confirm whether the photoresist is substantially defect-free or not according to a length of the third hot spot.

13. A method for inspecting a pattern, the method comprising:

detecting a measured image corresponding to a pattern formed on a substrate;

detecting a first hot spot corresponding to a ghost image of the measured image, wherein the ghost image represents a defect of the pattern, and wherein detecting the first hot spot comprises:

obtaining a first measured unicolored image comprising a first measured contour line by binarizing the measured image or by differentiating the measured image with respect to intensity; and determining whether the first hot spot exists in the first measured unicolored image and, if so, recording the first hot spot on the ghost image; and detecting a second hot spot that has an area that is wider than an area of the first hot spot, wherein detecting the second hot spot comprises:

differentiating the first measured unicolored image with respect to intensity to obtain a second measured unicolored image comprising a plurality of second contour lines; and determining whether the second hot spot exists in the second measured unicolored image and, if so, recording the second hot spot on the ghost image.

14. The method of claim 13, wherein the plurality of second contour lines comprise a second inner contour line and a second outer contour line that correspond to an inside and an outside of the first measured contour line, respectively.

15. The method of claim 14, wherein:

detecting the first hot spot comprises overlapping the first measured unicolored image with a first target unicolored image comprising a first target contour line to block the first measured contour line with the first target contour line, and detecting the second hot spot comprises overlapping the second measured unicolored image with a second target unicolored image comprising a second target contour line to block the second inner and outer contour lines with the second target contour line.

16. The method of claim 14, further comprising detecting a third hot spot that has a length that is longer than a length of the second hot spot, wherein detecting the third hot spot comprises:

obtaining a dummy measured unicolored image comprising a third contour center line between the second inner and outer contour lines of the second measured unicolored image;

dilating the third contour center line to obtain a third measured unicolored image comprising a third measured contour line; and determining whether the third hot spot exists in the third measured unicolored image and, if so, recording the third hot spot on the ghost image.

17. The method of claim 16, wherein detecting the third hot spot comprises overlapping the third measured unicolored image with a third target unicolored image comprising a third target contour line to block the third measured contour line with the third target contour line.

* * * * *